(12) United States Patent
Suzuki

(10) Patent No.: US 10,348,925 B2
(45) Date of Patent: Jul. 9, 2019

(54) IMAGE READING APPARATUS AND SEMICONDUCTOR DEVICE WITH A VOLTAGE BOOST CIRCUIT AND A READING CIRCUIT THAT REDUCE POWER CONSUMPTION

(71) Applicant: Seiko Epson Corporation, Tokyo (JP)

(72) Inventor: Takafumi Suzuki, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/602,695

(22) Filed: May 23, 2017

(65) Prior Publication Data

US 2017/0374227 A1  Dec. 28, 2017

(30) Foreign Application Priority Data

Jun. 28, 2016 (JP) .................................. 2016-127807

(51) Int. Cl.
| | |
|---|---|
| H04N 1/195 | (2006.01) |
| H01L 27/146 | (2006.01) |
| H04N 1/00 | (2006.01) |
| H04N 5/378 | (2011.01) |
| H04N 1/028 | (2006.01) |

(52) U.S. Cl.
CPC ... *H04N 1/19594* (2013.01); *H01L 27/14678* (2013.01); *H04N 1/00896* (2013.01); *H04N 1/028* (2013.01); *H04N 5/378* (2013.01); *H04N 2201/0081* (2013.01)

(58) Field of Classification Search
None
See application file for complete search history.

(56) References Cited

U.S. PATENT DOCUMENTS

| | | | |
|---|---|---|---|
| 6,452,151 B1 | 9/2002 | Tamagawa | |
| 9,854,190 B2 * | 12/2017 | Demonte | ............. H04N 5/3698 |
| 9,888,191 B2 * | 2/2018 | Beck | ...................... H04N 5/243 |

(Continued)

FOREIGN PATENT DOCUMENTS

JP  2001-156989 A  6/2001

OTHER PUBLICATIONS

Extended European Search Report for Patent Application No. EP17176701.5 dated Sep. 11, 2017 (7 pages).

*Primary Examiner* — Thomas D Lee
(74) *Attorney, Agent, or Firm* — Harness, Dickey & Pierce, P.L.C.

(57) ABSTRACT

An image reading apparatus includes a plurality of image reading chips. Each of the plurality of image reading chips includes, a pixel that includes a light receiving element which receives light and performs photoelectric conversion; a voltage boosting circuit that generates a transmission control signal for transmitting electric charges which are generated on the basis of the photoelectric conversion; and a reading circuit which generates an image signal on the basis of the electric charges which are transmitted. The voltage boosting circuit operates during a period in which the light receiving element receives the light and during a period in which the electric charges that are generated on the basis of the photoelectric conversion which is performed by the light receiving element, and stops an operation during a period in which the reading circuits of the other image reading chips output the image signals.

19 Claims, 17 Drawing Sheets

(56) References Cited

U.S. PATENT DOCUMENTS

| | | | |
|---|---|---|---|
| 2002/0186308 A1* | 12/2002 | Baer | H04N 5/2175 348/248 |
| 2005/0099530 A1* | 5/2005 | Mizobuchi | H04N 5/2256 348/370 |
| 2008/0061218 A1 | 3/2008 | Murakami et al. | |
| 2013/0250332 A1 | 9/2013 | Hiranuma | |

* cited by examiner

IMAGE READING APPARATUS AND SEMICONDUCTOR DEVICE WITH A VOLTAGE BOOST CIRCUIT AND A READING CIRCUIT THAT REDUCE POWER CONSUMPTION

The entire disclosure of Japanese Patent Application No. 2016-127807, filed Jun. 28, 2016 is expressly incorporated by reference herein.

BACKGROUND

1. Technical Field

The present invention relates to an image reading apparatus and a semiconductor device.

2. Related Art

An image reading apparatus (scanner or the like) which uses a contact image sensor, a copy machine in which a print function is added to the image reading apparatus, a complex printer, or the like is developed. The contact image sensor used in the image reading apparatus adopts a configuration in which a photodiode provided in a semiconductor substrate is used. The image reading apparatus such as a scanner includes a plurality of sensor chips in which a plurality of pixels having one or a plurality of photodiodes are arranged in parallel in one direction.

For example, JP-A-2001-156989 discloses an image reading apparatus in which photoelectric conversion signals are sequentially read from a plurality of sensor chips and each sensor chip can perform an output operation only during a period from a predetermined time when reading starts to reading ends.

According to the image reading apparatus described in JP-A-2001-156989, it is possible to promote low power consumption by preventing power consumption from being wasted. However, in the image reading apparatus described in JP-A-2001-156989, power saving is not considered except that the output operation stops, and thus, there is room for improvement.

SUMMARY

An advantage of some aspects of the invention is to provide an image reading apparatus and a semiconductor device which can achieve low power consumption.

The invention can be realized in the following aspects or application examples.

Application Example 1

According to this application example, there is provided an image reading apparatus including a plurality of image reading chips for reading an image, in which each of the plurality of image reading chips includes a pixel that includes a light receiving element which receives light from the image and performs photoelectric conversion, a voltage boosting circuit that generates a transmission control signal for transmitting electric charges which are generated on the basis of the photoelectric conversion that is performed by the light receiving element, and a reading circuit which generates an image signal on the basis of the electric charges which are transmitted and outputs the image signal, and in which the voltage boosting circuit operates during a period in which the light receiving element of the pixel receives the light and during a period in which the electric charges that are generated on the basis of the photoelectric conversion which is performed by the light receiving element are transmitted, and stops an operation during a period in which the reading circuits of the other image reading chips output the image signals.

In the image reading apparatus according to this application example, a voltage boosting circuit of each of a plurality of image reading chips stops an operation during a period in which reading circuits of the other image reading chips output image signals, and thus, each of the plurality of image reading chips can efficiently operate. Hence, in the image reading apparatus according to the application example, it is possible to reduce the total consumption current (a total of the consumption currents) of the plurality of image reading chips, and to achieve low power consumption.

Application Example 2

In the image reading apparatus according to the application example, each of the plurality of image reading chips may operate only in a period in which the reading circuit outputs the image signal.

In the image reading apparatus according to the application example, a reading circuit of each of a plurality of image reading chips stops an operation during a period in which an image signal is not output, and thus, each of the plurality of image reading chips can operate more efficiently. Hence, in the image reading apparatus according to the application example, it is possible to reduce the total consumption current of the plurality of image reading chips, and to achieve the lower power consumption.

Application Example 3

In the image reading apparatus according to the application example, each of the plurality of image reading chips may include a switch that determines whether or not to activate the pixel in response to the transmission control signal, and the electric charges that are generated on the basis of the photoelectric conversion which is performed by the light receiving element may be transmitted through the switch.

In the image reading apparatus according to the application example, a voltage boosting circuit of each of a plurality of image reading chips stops an operation during a period in which reading circuits of the other image reading chips output image signals, and thus, a transmission control signal is not generated and a pixel also stops an operation. Hence, in the image reading apparatus according to the application example, since each of the plurality of image reading chips can efficiently operate, it is possible to reduce the total consumption current of the plurality of image reading chips, and to achieve low power consumption.

Application Example 4

In the image reading apparatus according to the application example, the reading circuits of each of the plurality of image reading chips may stop operations during a period in which the reading circuits of the other image reading chips output the image signals.

In the image reading apparatus according to the application example, a reading circuit of each of a plurality of image reading chips stops an operation during a period in which reading circuits of the other image reading chips output image signals, and thus, each of the plurality of image reading chips can efficiently operate. Hence, in the image reading apparatus according to the application example, it is possible to reduce the total consumption current of the plurality of image reading chips, and to achieve low power consumption.

Application Example 5

In the image reading apparatus according to the application example, each of the plurality of image reading chips may operate in response to a clock signal that is supplied to an input terminal, and propagation of the clock signal may stop during a period in which the voltage boosting circuit and the reading circuit stop operations together.

In the image reading apparatus according to the application example, propagation of a clock signal which is supplied to an input terminal to an internal circuit stops during a period in which a voltage boosting circuit and a reading circuit stop operations together, in each of a plurality of image reading chips, and thus, a large consumption current necessary for propagating the clock signal can be reduced. Hence, in the image reading apparatus according to the application example, it is possible to further reduce the total consumption current of the plurality of image reading chips, and to achieve the lower power consumption.

Application Example 6

In the image reading apparatus according to the application example, the reading circuit of each of the plurality of image reading chips may include a pixel drive circuit that generates a drive signal for reading a signal from the pixel on the basis of the electric charges which are transmitted, and an output circuit that generates the image signal and outputs the image signal.

In the image reading apparatus according to the application example, a voltage boosting circuit of each of a plurality of image reading chips stops an operation during a period in which pixel drive circuits and output circuits of the other image reading chips operate, and thus, each of the plurality of image reading chips can efficiently operate. Hence, in the image reading apparatus according to the application example, it is possible to reduce the total consumption current of the plurality of image reading chips, and to achieve low power consumption.

Application Example 7

According to this application example, there is provided a semiconductor device including a pixel that includes a light receiving element which receives light and performs photoelectric conversion; a voltage boosting circuit that generates a transmission control signal for transmitting electric charges which are generated on the basis of the photoelectric conversion that is performed by the light receiving element; a reading circuit which generates an image signal on the basis of the electric charges which are transmitted and outputs the image signal; and an input terminal to which a control signal is input, in which the voltage boosting circuit operates during a predetermined period after the control signal is input to the input terminal, and stops an operation during a period after outputting the image signal ends.

In the semiconductor device according to the application example, a voltage boosting circuit stops an operation during a period in which outputting an image signal ends, and thus, each of a plurality of image reading chips can efficiently operate. Hence, in the semiconductor device according to the application example, it is possible to reduce the total consumption current of the plurality of image reading chips, and to achieve low power consumption.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, appropriate embodiments of the invention will be described in detail by using the drawings. The drawings which are used are for the sake of convenience of description. The embodiments which will be described below are not intended to unduly limit content of the invention described in the scope of claims. In addition, all the configurations which will be described below are not necessarily essential components of the invention.

Hereinafter, a complexer (complex device) 1 applied to an image reading apparatus according to the present embodiment will be described with reference to the accompanying drawings.

1. First Embodiment

1-1. Structure of Complexer

Figure 1:
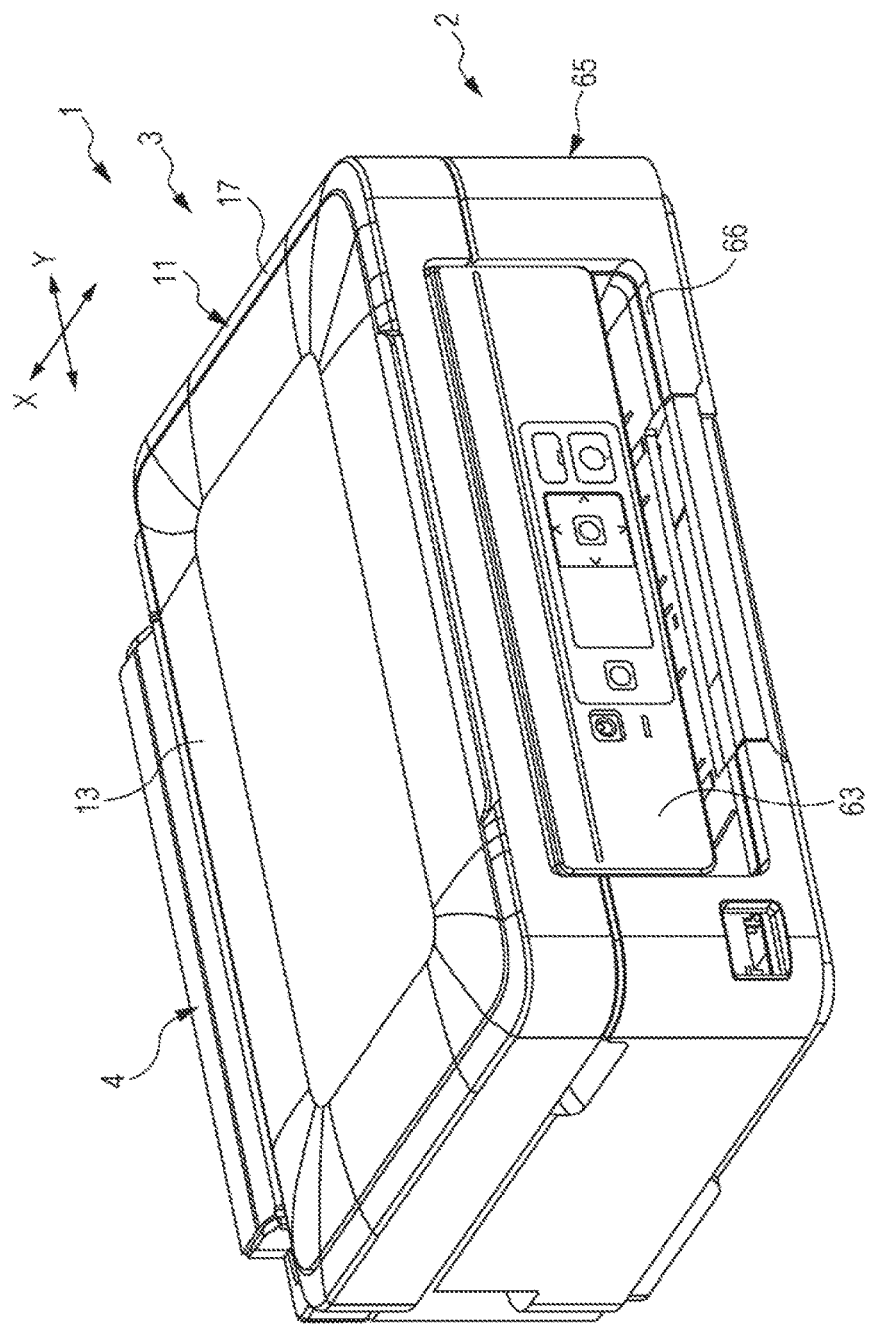
FIG. 1 is an external perspective view illustrating a complexer according to the present embodiment.

FIG. 1 is an external perspective view illustrating the complexer 1. As illustrated in FIG. 1, the complexer 1 includes a printer unit (image recording device) 2 which is a device body, and a scanner unit (image reading apparatus) 3 that is an upper unit disposed in an upper portion of the printer unit 2, as one piece. Hereinafter, description will be made by setting a front-back direction as an X-axis direction and a left-right direction as a Y-axis direction, in FIG. 1.

Meanwhile, as illustrated in FIG. 1, the printer unit 2 includes a transport unit (not illustrated) which feeds a recording medium of sheet (print paper or cut paper) along a feeding path, a print unit (not illustrated) which is disposed on an upper portion of the feeding path and performs print processing on the recording medium by using an ink jet method, an operation unit 63 of a panel type which is disposed on a front surface, another transport unit, a device frame (not illustrated) in which the printer unit and the operation unit 63 are mounted, and a device housing which covers those. An outlet 66 through which the recording medium whose printing is completed is discharged is provided in the device housing 65. In addition, a USB port and a power port, which are not illustrated, are disposed in a lower portion of a rear surface. That is, the complexer 1 is configured to be able to be connected to a computer or the like through the USB port.

The scanner unit 3 is rotatably supported to the printer unit 2 through a hinge unit 4 of a rear end portion, and covers an upper portion of the printer unit 2 to be freely opened and closed. That is, by pulling up the scanner unit 3 in a rotation direction, an opening of an upper surface of the printer unit 2 is exposed, and an internal portion of the printer unit 2 is exposed through the opening of the upper portion. Meanwhile, by pulling down the scanner unit 3 in the rotation direction to mount on the printer unit 2, the opening of the upper portion is closed by the scanner unit 3. As such, by opening the scanner unit 3, it is possible to provide a configuration for replacing an ink cartridge, solving paper jam, and the like.

Figure 2:
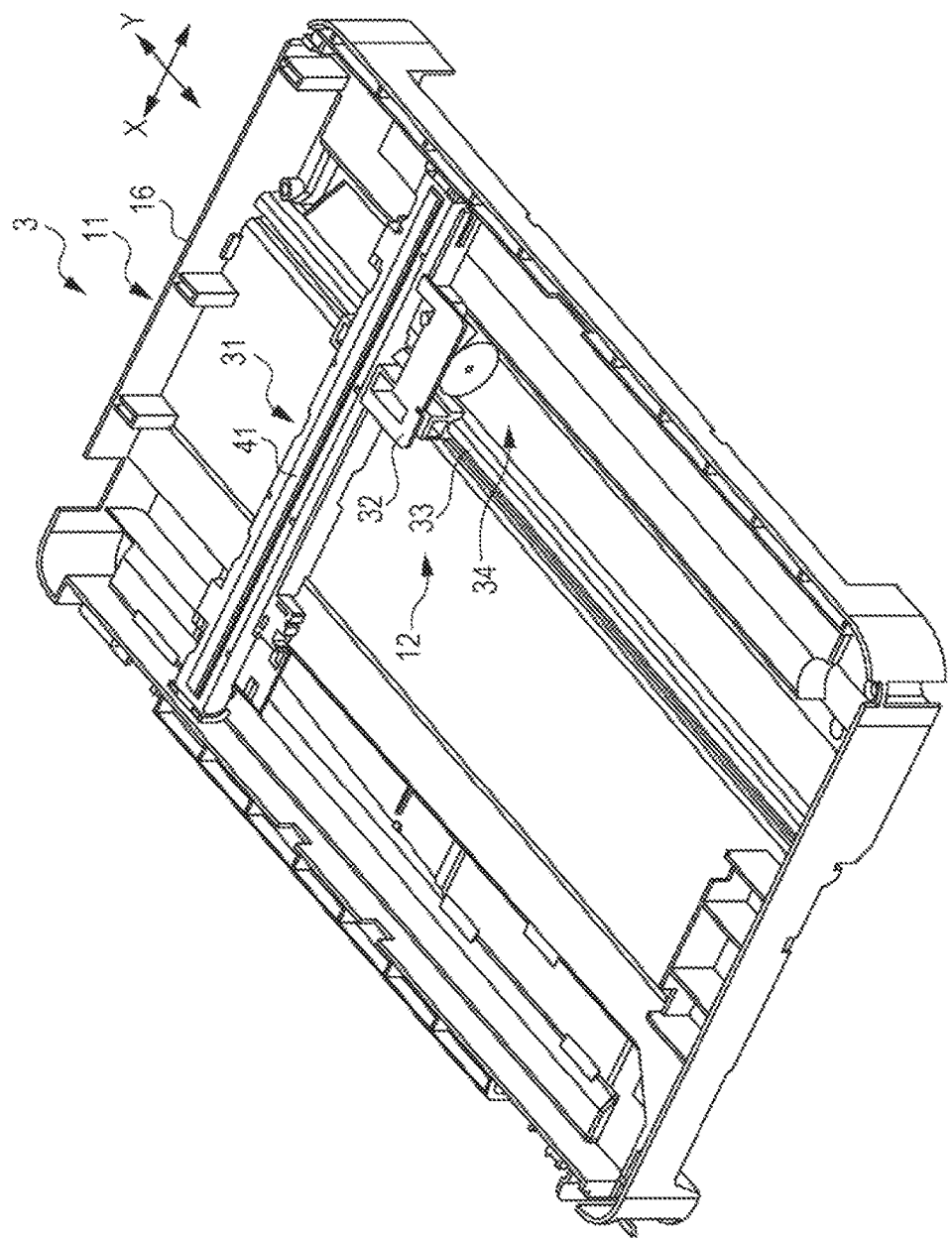
FIG. 2 is a perspective view illustrating an internal structure of a scanner unit.

FIG. 2 is a perspective view illustrating an internal structure of the scanner unit 3. As illustrated in FIGS. 1 and 2, the scanner unit 3 includes an upper frame 11 which is a housing, an image reading unit 12 accommodated in the upper frame 11, an upper cover 13 rotatably supported to an upper portion of the upper frame 11. As illustrated in FIG. 2, the upper frame 11 includes a box-shaped lower case which accommodates the image reading unit 12, and an upper case 17 which covers a top surface of the lower case 16. A document mounting plate (document table: not illustrated) made of glass is widely disposed on the upper case 17, and a medium to be read (document) with a surface to be read facing down is mounted thereon. Meanwhile, the lower case 16 is formed in a shallow box shape with an open upper surface.

As illustrated in FIG. 2, the image reading unit 12 includes a sensor unit 31 of a line sensor type, a sensor carriage 32 on which the sensor unit 31 is mounted, a guide shaft 33 which extend in the Y-axis direction and slidably supports the sensor carriage 32, and a self-propelled sensor moving mechanism 34 which moves the sensor carriage 32 along the guide shaft 33. The sensor unit 31 includes an image sensor module 41 which is a complementary metal-oxide-semiconductor (CMOS) line sensor extending in the X-axis direction, and performs reciprocation by the motor-driven sensor moving mechanism 34 along the guide shaft 33 in the Y-axis direction. Thereby, an image of the medium to be read (document) on the document mounting plate is read.

Figure 3:
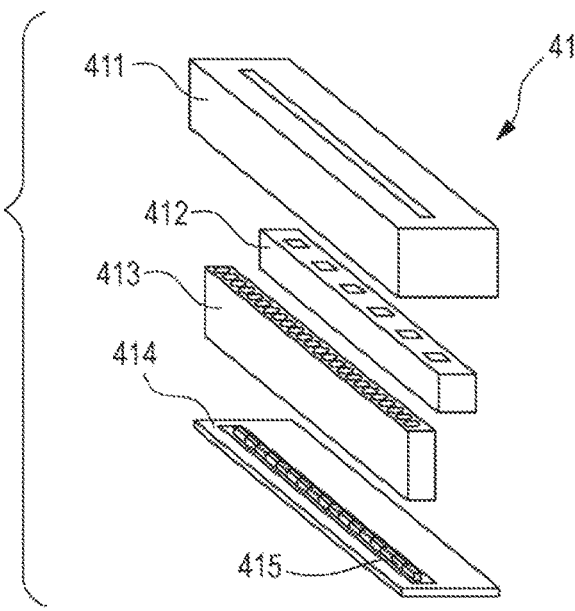
FIG. 3 is an exploded perspective view schematically illustrating a configuration of an image sensor module.

FIG. 3 is an exploded perspective view schematically illustrating a configuration of the image sensor module 41. In an example illustrated in FIG. 3, the image sensor module 41 is configured to include a case 411, a light source 412, a lens 413, a module substrate 414, and an image reading chip 415 (semiconductor device) for reading an image. The light source 412, the lens 413, and the image reading chip 415 are accommodated between the case 411 and the module substrate 414. A slit is provided in the case 411. The light source 412 includes each light emitting diode (LED) of, for example, R, G, and B, and makes each light emitting diode (red LED, green LED, and blue LED) of R, G, and B sequentially emit light while switching at high speed. The light source 412 irradiates the medium to be read with light through the slit, and the light from the medium to be read is incident on the lens 413 through the slit. The lens 413 guides the light which is incident to the image reading chip 415.

Figure 4:
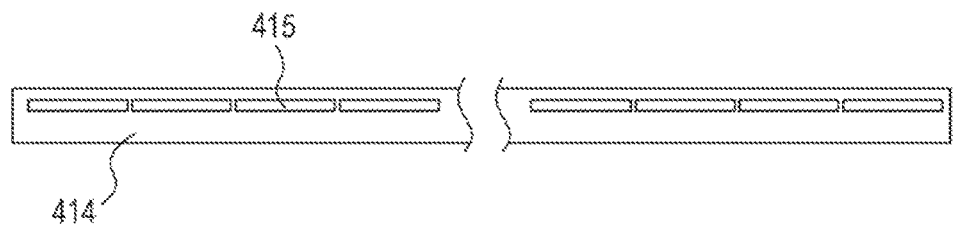
FIG. 4 is a plan view schematically illustrating arrangement of image reading chips.
Figure 4:
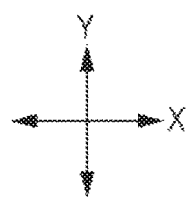

FIG. 4 is a plan view schematically illustrating arrangement of the image reading chips 415. As illustrated in FIG. 4, a plurality of (m pieces) the image reading chips 415 is arranged in parallel on the module substrate 414 in a one-dimensional direction (X-axis direction in FIG. 4). Each image reading chip 415 includes multiple light receiving elements which are arranged in a column (refer to FIGS. 6 and 8), and the higher density of the light receiving elements included in the image reading chip 415 is, the scanner unit 3 (image reading apparatus) with the higher resolution for reading an image can be realized. In addition, the larger the number of the image reading chips 415 is, the scanner unit 3 (image reading apparatus) which can also read the larger image can be realized.

1-2. Functional Configuration of Scanner Unit (Image Reading Apparatus)

Figure 5:
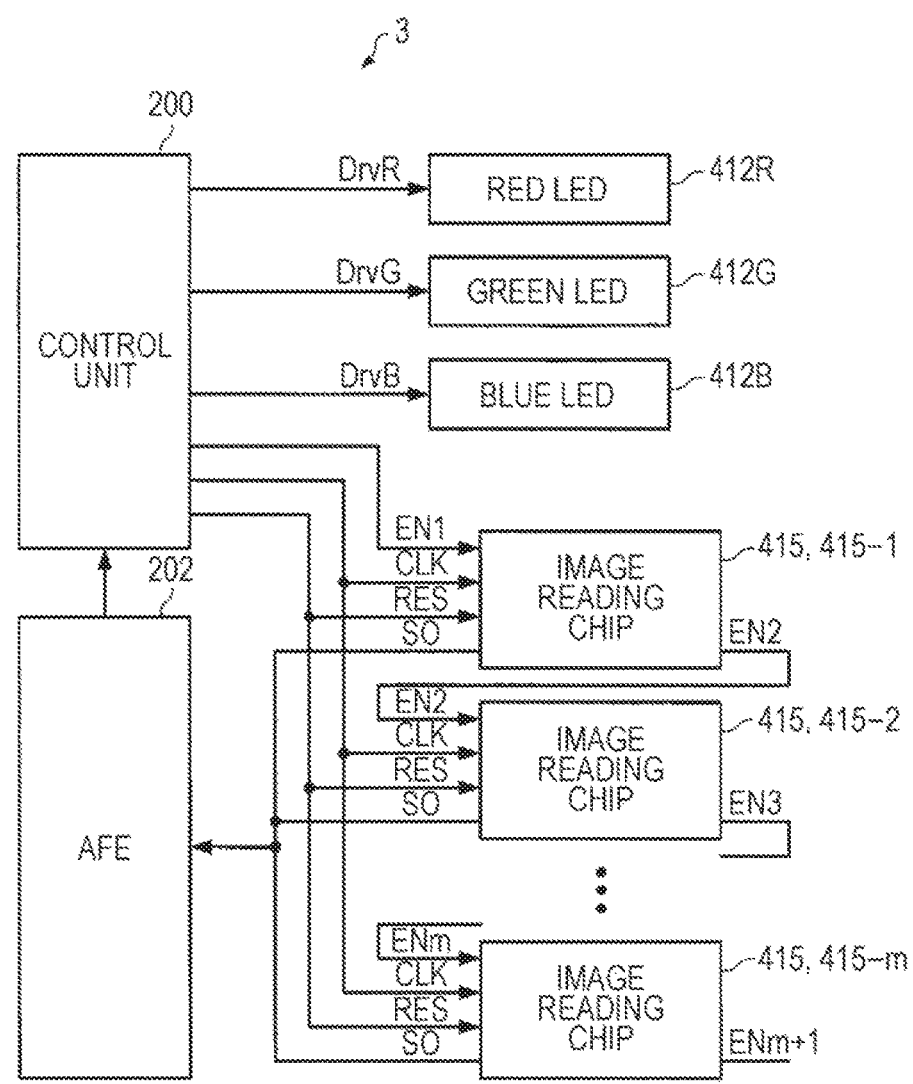
FIG. 5 is a diagram illustrating a functional configuration example of a scanner unit.

FIG. 5 is a functional block diagram illustrating a functional configuration example of the scanner unit 3 (image reading apparatus). In an example illustrated in FIG. 5, the scanner unit (image reading apparatus) 3 is configured to include a control unit 200, an analog front end (AFE) 202, a red LED 412R, a green LED 412G, a blue LED 412B, and m image reading chips 415 (415-1 to 415-m). As described above, the red LED 412R, the green LED 412G, and the blue LED 412B are included in the light source 412, and a plurality of the image reading chips 415 is arranged on the module substrate 414. Each of the red LED 412R, the green LED 412G, and the blue LED 412B may be plural. In addition, the control unit 200 and the analog front end (AFE) 202 are included in a substrate (not illustrated) different from the module substrate 414. Each of the control unit 200 and the analog front end (AFE) 202 may be realized by an integrated circuit (IC).

The control unit 200 supplies a drive signal DrvR to the red LED 412R only during a predetermined exposure time Δt in a predetermined period T, and makes the red LED 412R emit light. In the same manner, the control unit 200 makes the green LED 412G emit light by supplying a drive signal DrvG to the green LED 412G only during the exposure time Δt in the period T, and makes the blue LED 412B emit light by supplying a drive signal DrvB to the blue LED 412B only during the exposure time Δt in the period T.

The control unit 200 makes the red LED 412R, the green LED 412G, and the blue LED 412B exclusively and sequentially emit light by one during the period T.

In addition, the control unit 200 commonly supplies a clock signal CLK and a resolution setting signal RES to the m image reading chips 415 (415-1 to 415-m). The clock signal CLK is an operation clock signal of the m image reading chips 415, and each of the m image reading chips 415 operates on the basis of the clock signal CLK. In addition, the resolution setting signal RES sets a resolution of an image which is read by the scanner unit (image reading apparatus) 3. The resolution is set by the number of rising edges of the clock signal CLK during a period in which the resolution setting signal RES is active (high level in the present embodiment). It is assumed that each resolution of 300 dpi, 600 dpi, and 1200 dpi is set, in a case where the number of the rising edges of the clock signal CLK is 2, 4, and 8 during the period in which the resolution setting signal RES is active (high level), in the present embodiment.

If each light receiving element receives light from an image which is formed in the medium to be read and thereafter receives a chip enable signal ENj (high pulse signal in the present embodiment), each image reading chip 415-j (j=1 to m) generates an image signal SO with image information of a resolution set by the resolution setting signal RES, based on the light which is received by each light receiving element, in synchronization with the clock signal CLK, and outputs the image signal. In the present embodiment, after making the red LED 412R, the green LED 412G, or the blue LED 412B emit light, the control unit 200 generates the chip enable signal EN1 which is active (high level) for a predetermined time (time until the image reading chip 415-1 outputs the image signal SO) to supply to the image reading chip 415-1. In addition, the image reading chip 415-j (j=1 to m) generates the chip enable signal ENj+1 (high pulse signal) shortly before output of the image signal SO ends and supply the generated signal to the image reading chip 415-j+1. Thereby, after the red LED 412R, the green LED 412G, or the blue LED 412B emits light, the m image reading chips 415 (415-1 to 415-m) sequentially output the image signals SO. A detailed circuit configuration and an operation of the image reading chip 415 will be described below.

The analog front end (AFE) 202 receives the image signals SO which are sequentially output from the m image reading chips 415 (415-1 to 415-m), performs amplification processing or A/D conversion processing for each image signal SO, converts the processed signals into digital signals having digital values corresponding to the amount of received light of each light receiving element, and sequentially transmits each digital signal to the control unit 200.

The control unit 200 receives each digital signal which is sequentially transmitted from the analog front end (AFE) 202, and generates image information that the image sensor module 41 reads.

1-3. Configuration and Operation of Image Reading Chip

Figure 6:
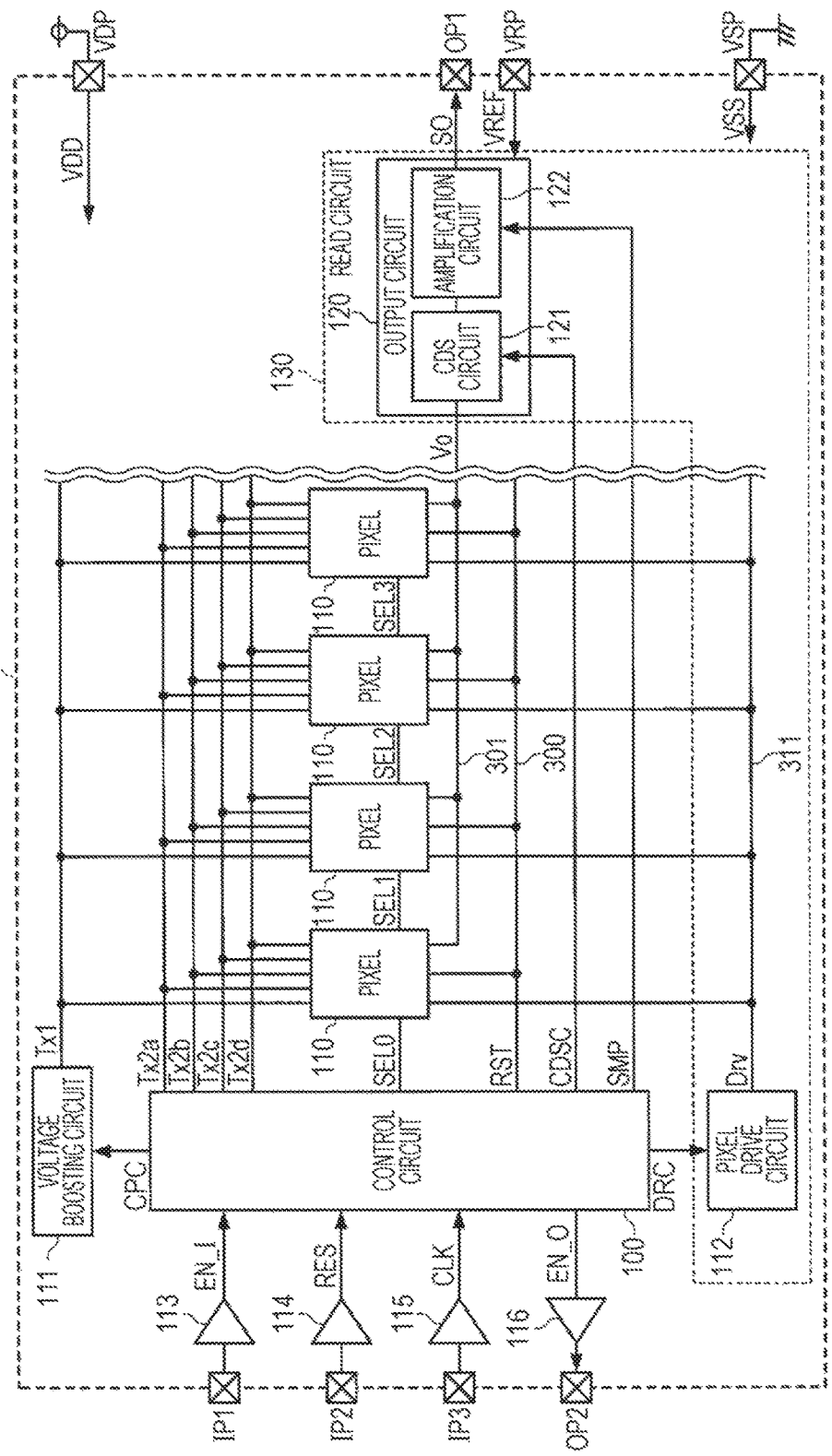
FIG. 6 is a functional block diagram of the image reading chip.

FIG. 6 is a functional block diagram of the image reading chip 415. The image reading chip 415 illustrated in FIG. 6 includes a control circuit 100, a voltage boosting circuit 111, a pixel drive circuit 112, n pixels 110, and an output circuit 120. The image reading chip 415 includes two power supply terminals VDP and VSP to which a power supply voltage VDD (for example, 3.3 V) and a power supply voltage VSS (for example, 0 V) are respectively supplied, and operates on the basis of a chip enable signal EN_I (one of the chip enable signals EN1 to ENm of FIG. 5), the resolution setting signal RES, and the clock signal CLK which are respectively input through three input terminals IP1, IP2, and IP3, and a reference voltage VREF which is supplied through a reference voltage supply terminal VRP.

The chip enable signal EN_I, the resolution setting signal RES, and the clock signal CLK are input to the control circuit 100 through input buffers 113, 114, and 115 respectively. The control circuit 100 controls operations of the voltage boosting circuit 111, the pixel drive circuit 112, the n pixels 110, and the output circuit 120, and an operation of an output buffer 116 in response to the chip enable signal EN_I, the resolution setting signal RES, and the clock signal CLK. Specifically, the control circuit 100 generates a control signal CPC which controls the voltage boosting circuit 111, a control signal DRC which control the pixel drive circuit 112, a control signal CDSC which controls a correlated double sampling (CDS) circuit 121 included in the output circuit 120, a sampling signal SMP which controls an amplification circuit 122 included in the output circuit 120, a pixel selection signal SEL0 which controls the pixel 110, a reset signal RST, a second transmission control signal Tx2 (Tx2a, Tx2b, Tx2c, Tx2d), and a chip enable signal EN_O which controls the output buffer 116. A detailed circuit configuration and an operation of the control circuit 100 will be described below.

The voltage boosting circuit 111 boosts a voltage of the power supply voltage VDD in response to the control signal CPC from the control circuit 100, and generates a first transmission control signal Tx1 which sets the boosted power supply voltage to a high level. The first transmission control signal Tx1 is a control signal for transmitting electric charges (electric charges accumulated in the light receiving element) generated on the basis of photoelectric conversion which is performed by the light receiving element during the exposure time $\Delta t$, and is commonly supplied to the n pixels 110.

The pixel drive circuit 112 generates the drive signal Drv which drives the n pixels 110, based on the control signal DRC from the control circuit 100. The n pixels 110 are provided in parallel in one-dimensional direction, and the drive signal Drv are transmitted to the n pixels 110 by the drive signal lines 311. The ith (i is one of 1 to n) pixel 110 outputs an output signal (pixel signal) by making a pixel selection signal SELi active (high level), when the drive signal Drv is active (high level) and the pixel selection signal SELi−1 is active (high level). The pixel selection signal SELi is output to the (i+1)th pixel 110.

The n pixels 110 includes the light receiving elements which receive light from an image formed in a medium to be read and performs photoelectric conversion, and output pixel signals of voltages corresponding to the light that the light receiving elements receive during the exposure time $\Delta t$ in response to the first transmission control signal Tx1, the second transmission control signal Tx2, the pixel selection signal SEL (one of SEL0 to SELn−1), the reset signal RST, and the drive signal Drv, respectively. Output signals (pixel signals) which are output from the n pixels 110 are sequentially transmitted to the output circuit 120 through an output signal line 301. The n pixels 110 have all the same configuration, and a specific circuit configuration and an operation thereof will be described below.

The output circuit 120 generates and outputs the image signal SO by performing predetermined signal processing for the pixel signals which are output from each of the n pixels 110. In the present embodiment, the output circuit 120 includes a CDS circuit 121 and an amplification circuit 122.

The CDS circuit 121 receives an image signal Vo which sequentially includes the pixel signals that are respectively output from the n pixels 110 through the output signal line 301, and operates on the basis of the control signal CDSC from the control circuit 100. The CDS circuit 121 removes noise which is caused by characteristic variation of amplification transistors included in the n pixels 110 and is superimposed on the image signal Vo, by performing correlated double sampling based on the reference voltage VREF. That is, the CDS circuit 121 is a noise reduction circuit which reduces noise included in the output signals (pixel signals) which are output from the n pixels 110.

The amplification circuit 122 samples a signal whose noise is removed by the CDS circuit 121 in response to the sampling signal SMP, amplifies the sampled signal, and generates the image signal SO. That is, the amplification circuit 122 amplifies the output signals (pixel signals) which are output from the n pixels 110. As described above, the image signal SO is output from the image reading chip 415 through an output terminal OP1, and is supplied to the analog front end (AFE) 202 (refer to FIG. 5).

A circuit including the pixel drive circuit 112 and the output circuit 120 functions as a reading circuit 130 which generates and outputs the image signal SO, based on electric charges which are generated on the basis of photoelectric conversion that is performed by the light receiving element and which are transmitted by the first transmission control signal Tx1 and the second transmission control signal Tx2, in the pixel 110.

The control circuit 100 generates the chip enable signal EN_O (one of the chip enable signals EN2 to ENm+1 of FIG. 5) which is a signal of a high pulse shortly before an output of the image signal SO from the output circuit 120 ends, and outputs the generated signal to the image reading chip 415 in a next stage from an output terminal OP2 through the output buffer 116. Thereafter, the control circuit 100 stops the outputting the image signal SO to the output circuit 120, and drives an output terminal OP1 to high impedance.

Figure 7:
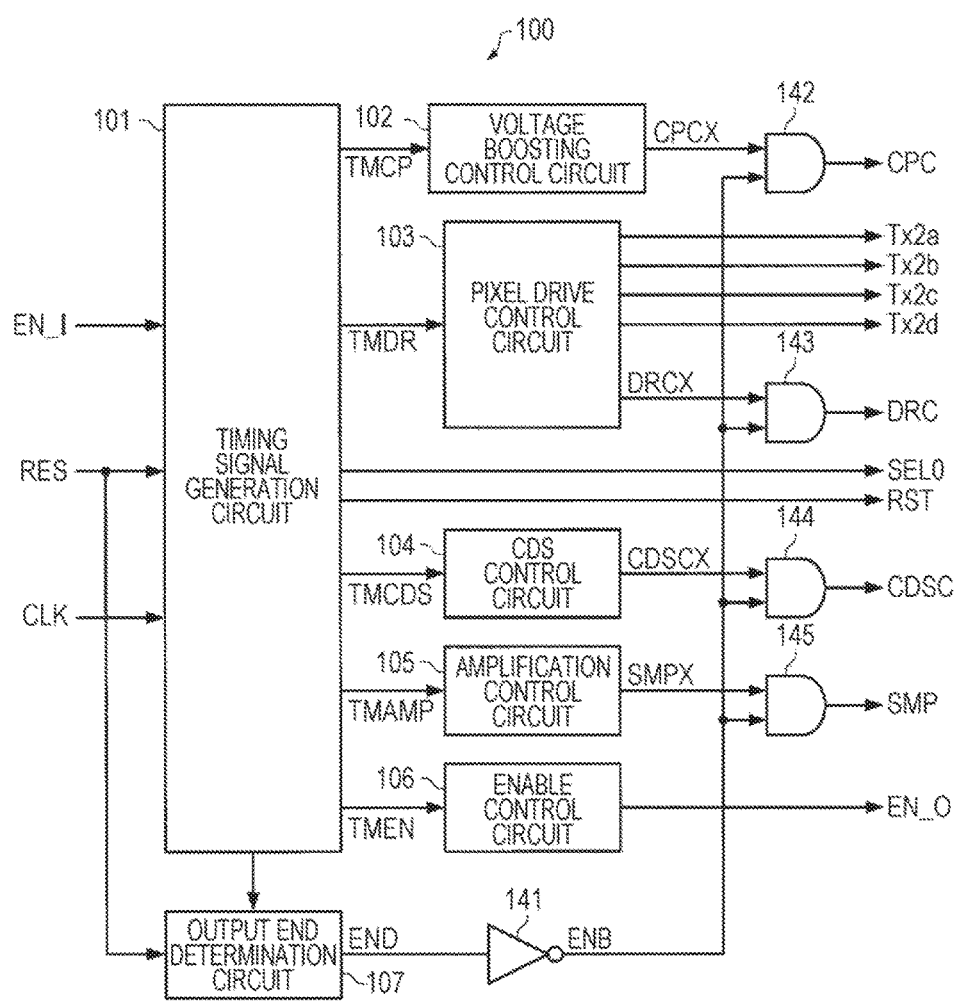
FIG. 7 is a diagram illustrating a configuration example of a control circuit.

FIG. 7 is a diagram illustrating a configuration example of the control circuit 100. As illustrated in FIG. 7, the control circuit 100 includes a timing signal generation circuit 101, a voltage boosting control circuit 102, a pixel drive control circuit 103, a CDS control circuit 104, an amplification control circuit 105, an enable control circuit 106, and an output end determination circuit 107. In addition, the control circuit 100 includes a NOT circuit 141 and four AND circuits 142, 143, 144, and 145.

The timing signal generation circuit 101 samples the resolution setting signal RES at timing when the clock signal CLK rises, and continuously counts the number of sampling of the resolution setting signal RES of a high level, in a case where the sampled resolution setting signal RES is in a high level. The timing signal generation circuit 101 retains bit data indicating each resolution of 300 dpi if the counted value is 2, 600 dpi if the counted value is 4, and 1200 dpi if the counted value is 8, in a resolution setting register (not illustrated).

In addition, the timing signal generation circuit 101 includes a timer (counter) (not illustrated) which operates in response to the clock signal CLK, and generates timing signals TMCP, TMDR, TMCDS, and TMAMP, based on the bit data retained in the resolution setting register and a value of the timer.

In addition, the timing signal generation circuit 101 receives the chip enable signal EN_I (high pulse), generates the pixel selection signal SEL0 which is active (high level in the present embodiment) for a predetermined time, and outputs the generated signal to the first pixel 110.

In addition, the timing signal generation circuit 101 outputs the pixel selection signal SEL0, and thereafter, generates the reset signal RST which initializes electric charges that are accumulated in the n pixels 110 at predetermined timing. In the present embodiment, the reset signal RST is commonly supplied to the n pixels 110. Accordingly, the image reading chip 415 includes a control signal line 300 for transmitting the reset signal RST to the n pixels 110.

The voltage boosting control circuit 102 receives the timing signal TMCP, and outputs a control signal CPCX for controlling the voltage boosting circuit 111 at predetermined timing. For example, a control signal which is output from the voltage boosting control circuit 102 may be a clock signal for voltage boosting which is performed by the voltage boosting circuit 111.

The pixel drive control circuit 103 receives the timing signal TMDR and generates the second transmission control signal Tx2. In the present embodiment, the second transmission control signal Tx2 is configured with four signals Tx2a, Tx2b, Tx2c, and Tx2d, and a signal which is active (high level in the present embodiment) changes in accordance with the bit data which is retained in the resolution setting register. Specifically, when the bit data indicates a resolution of 1200 dpi, only the signal Tx2a becomes active (high level) in first one cycle of the clock signal CLK, only the signal Tx2b becomes active (high level) in second one cycle, only the signal Tx2c becomes active (high level) in third one cycle, and only the signal Tx2d becomes active (high level) in fourth one cycle, among the second transmission control signals Tx2. In addition, when the bit data indicates a resolution of 600 dpi, only two signals Tx2a and Tx2b simultaneously become active (high level) in one cycle of the clock signal CLK, and only two signals Tx2c and Tx2d simultaneously become active (high level) in next one cycle, among the second transmission control signals Tx2. In addition, when the bit data indicates a resolution of 300 dpi, the four signals Tx2a, Tx2b, Tx2c, and Tx2d of the second transmission control signal Tx2 simultaneously become active (high level) in one cycle of the clock signal CLK.

In addition, the pixel drive control circuit 103 receives the timing signal TMDR and outputs a control signal DRCX for controlling the pixel drive circuit 112 at predetermined timing.

The CDS control circuit 104 receives the timing signal TMCDS and outputs a control signal CDSCX for controlling the CDS circuit 121 at predetermined timing.

The amplification control circuit 105 receives the timing signal TMAMP and outputs a sampling signal SMPX for controlling the amplification circuit 122 at predetermined timing.

The enable control circuit 106 receives a timing signal TMEN and generates the chip enable signal EN_O at predetermined timing.

The output end determination circuit 107 determines whether or not an output of the image signal SO from the reading circuit 130 (output circuit 120) ends, based on the bit data retained in the resolution setting register included in the timing signal generation circuit 101 and the value of the timer included therein, and outputs an end signal END which is active (high level in the present embodiment) in a case where it is determined that the output end. In addition, the output end determination circuit 107 makes the end signal END inactive (low level) if a pulse of the resolution setting signal RES is input. That is, in the present embodiment, the end signal END is inactive (low level) until outputting the image signal SO ends after the pulse of the resolution setting signal RES is input, and is active (high level) until next pulse of the resolution setting signal RES is input after outputting the image signal SO ends.

The NOT circuit 141 outputs an enable signal ENB which is obtained by inverting a logic level of the end signal END that is output from the output end determination circuit 107. Hence, the enable signal ENB is in a high level until outputting the image signal SO ends after a pulse of the resolution setting signal RES is input, and is in a low level until the pulse of the resolution setting signal RES is input after outputting the image signal SO ends.

The AND circuit 142 outputs a signal which is obtained by performing logical product of the control signal CPCX that is output from the voltage boosting control circuit 102 and the enable signal ENB, and an output signal of the AND circuit 142 is supplied to the voltage boosting circuit 111 as the control signal CPC.

The AND circuit 143 outputs a signal which is obtained by performing logical product of the control signal DRCX that is output from the pixel drive control circuit 103 and the enable signal ENB, and an output signal of the AND circuit 143 is supplied to the pixel drive circuit 112 as the control signal DRC.

The AND circuit 144 outputs a signal which is obtained by performing logical product of the control signal CDSCX that is output from the CDS control circuit 104 and the enable signal ENB, and an output signal of the AND circuit 144 is supplied to the CDS circuit 121 as the control signal CDSC.

The AND circuit 145 outputs a signal which is obtained by performing logical product of the sampling signal SMPX that is output from amplification control circuit 105 and the enable signal ENB, and an output signal of the AND circuit 145 is supplied to the amplification circuit 122 as the sampling signal SMP.

While the enable signal ENB is in a high level, that is, while the pulse of the resolution setting signal RES is input and outputting the image signal SO ends, the control signal CPCX, the control signal DRCX, the control signal CDSCX, and the sampling signal SMPX respectively propagate through the AND circuit 142, the AND circuit 143, the AND circuit 144, and the AND circuit 145, thereby, respectively becoming the control signal CPC, the control signal DRC, the control signal CDSC, and the sampling signal SMP. Accordingly, the voltage boosting circuit 111 and the reading circuit 130 (pixel drive circuit 112 and output circuit 120) operate. In contrast, while the enable signal ENB is in a low level, that is, while outputting the image signal SO ends and the pulse of the resolution setting signal RES is input, the control signal CPC, the control signal DRC, the control signal CDSC, and the sampling signal SMP are all fixed to a low level, and thereby, the voltage boosting circuit 111 and the reading circuit 130 (pixel drive circuit 112 and output circuit 120) stop operating.

In other words, the voltage boosting circuit 111 and the reading circuit 130 operate for a predetermined period (period until outputting the image signal SO ends) after the resolution setting signal RES (an example of the "control signals") is input, and stop the operation for the period after outputting the image signal SO ends.

Figure 8:
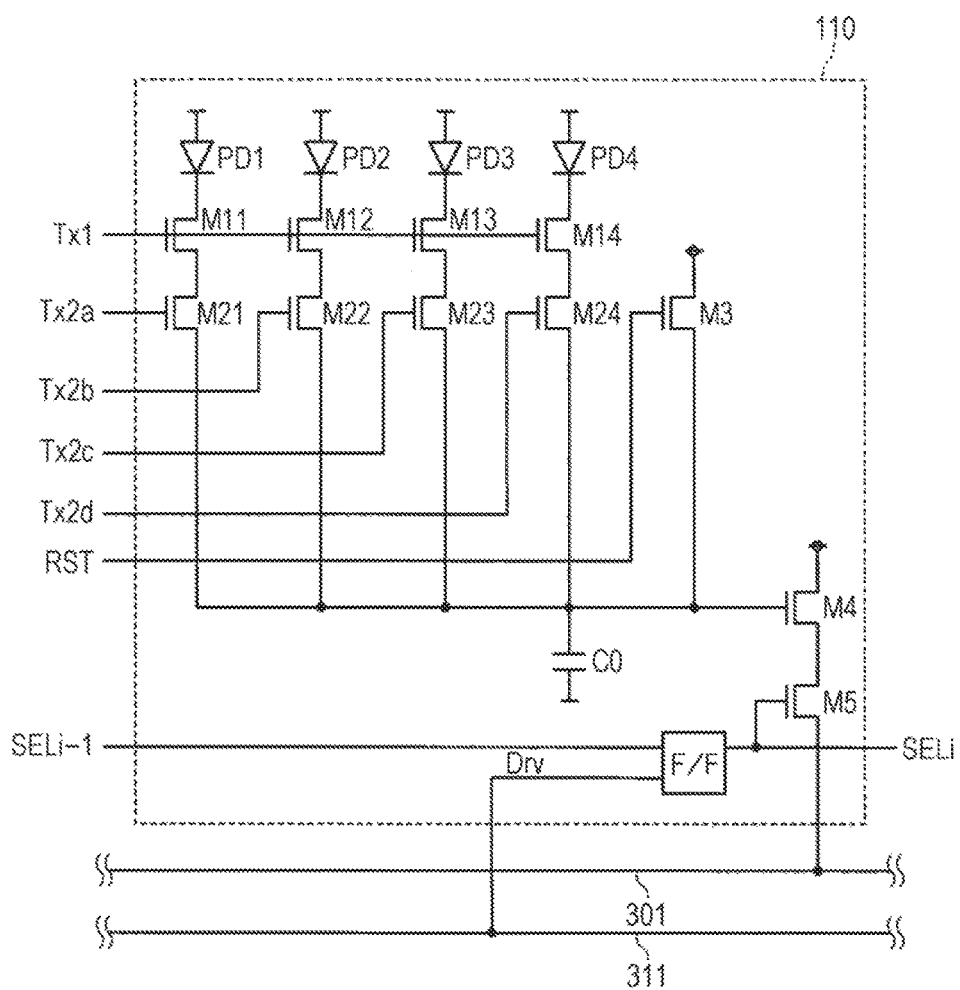
FIG. 8 is a diagram illustrating a configuration of a pixel.

FIG. 8 is a diagram illustrating a configuration of the pixel 110 (ith pixel 110). As illustrated in FIG. 8, the pixel 110 includes four light receiving elements PD1, PD2, PD3, and PD4. That is, the pixel 110 includes four pixels.

The light receiving elements PD1, PD2, PD3, and PD4 receive light (light from an image formed in a medium to be read, in the present embodiment) and performs conversion (photoelectric conversion) of the light into electrical signals. In the present embodiment, the light receiving elements PD1, PD2, PD3, and PD4 are configured with photodiodes, and anodes thereof are grounded. A cathode of the light receiving element PD1 is connected to a source of an NMOS transistor M11, a cathode of the light receiving element PD2 is connected to a source of an NMOS transistor M12, a cathode of the light receiving element PD3 is connected to a source of an NMOS transistor M13, and a cathode of the light receiving element PD4 is connected to a source of an NMOS transistor M14.

A drain of the NMOS transistor M11 is connected to a source of the NMOS transistor M21, a drain of the NMOS transistor M12 is connected to a source of the NMOS transistor M22, a drain of the NMOS transistor M13 is connected to a source of the NMOS transistor M23, and a drain of the NMOS transistor M14 is connected to a source of the NMOS transistor M24. Each gate of the four NMOS transistors M11, M12, M13, and M14 receives the first transmission control signal Tx1. Hence, the NMOS transistors M11, M12, M13, and M14 function as switches which determine whether or not to be turned on in response to the first transmission control signal Tx1.

Each drain of the four NMOS transistors M21, M22, M23, and M24 is commonly connected to a source of an NMOS transistor M3, a gate of an NMOS transistor M4, and one terminal of a capacitor C0. The other terminal of the capacitor C0 is grounded. A gate of the NMOS transistor M21 receives the signal Tx2$a$, a gate of the NMOS transistor M22 receives the signal Tx2$b$, a gate of the NMOS transistor M23 receives the signal Tx2$c$, and a gate of the NMOS transistor M24 receives the signal Tx2$d$.

A drain of the NMOS transistor M3 receives a power supply voltage, and a gate of the NMOS transistor M3 receives the reset signal RST.

A drain of the NMOS transistor M4 receives the power supply voltage, and a source of the NMOS transistor M4 is connected to a drain of an NMOS transistor M5.

A source of the NMOS transistor M5 is connected to the output signal line 301, and a gate of the NMOS transistor M5 receives an output signal (pixel selection signal SELi) of a flip-flop (F/F).

The flip-flop (F/F) receives the pixel selection signal SELi−1 and the drive signal Drv, the pixel selection signal SELi−1 is input at the time of rising edge of the drive signal Drv, and the flip-flop outputs the delayed pixel selection signal SELi. The pixel selection signal SELi becomes an asynchronous reset signal of the flip-flop (F/F) through an unillustrated delay circuit. Accordingly, the pixel selection signal SELi becomes inactive (low level) after a predetermined time passes after becoming active (high level).

The ith pixel 110 configured in this way operates as below. First, the first transmission control signal Tx1, the second transmission control signal Tx2 (Tx2$a$, Tx2$b$, Tx2$c$, and Tx2$d$), the pixel selection signal SELi−1, and the drive signal Drv are all inactive (low level), during the exposure time Δt, and the light receiving elements PD1, PD2, PD3, and PD4 accumulate the electric charges (negative electric charges) corresponding to the received light.

Next, only the first transmission control signal Tx1 becomes active (high level), and the four NMOS transistors M11, M12, M13, and M14 are all turned on. Thereby, the electric charges (electric charges accumulated in the light receiving element PD1 (negative electric charges)) which are generated on the basis of the photoelectric conversion that is performed by the light receiving element PD1 are transmitted to an intermediate capacitor C1 (not illustrated)

formed at a connection node between the drain of the NMOS transistor M11 and the source of the NMOS transistor M21 through the NMOS transistor M11, and are accumulated therein. In addition, the electric charges (electric charges accumulated in the light receiving element PD2 (negative electric charges)) which are generated on the basis of the photoelectric conversion that is performed by the light receiving element PD2 are transmitted to an intermediate capacitor C2 (not illustrated) formed at a connection node between the drain of the NMOS transistor M12 and the source of the NMOS transistor M22 through the NMOS transistor M12, and are accumulated therein. In addition, the electric charges (electric charges accumulated in the light receiving element PD3 (negative electric charges)) which are generated on the basis of the photoelectric conversion that is performed by the light receiving element PD3 are transmitted to an intermediate capacitor C3 (not illustrated) formed at a connection node between the drain of the NMOS transistor M13 and the source of the NMOS transistor M23 through the NMOS transistor M13, and are accumulated therein. In addition, the electric charges (electric charges accumulated in the light receiving element PD4 (negative electric charges)) which are generated on the basis of the photoelectric conversion that is performed by the light receiving element PD4 are transmitted to an intermediate capacitor C4 (not illustrated) formed at a connection node between the drain of the NMOS transistor M14 and the source of the NMOS transistor M24 through the NMOS transistor M14, and are accumulated therein.

Next, the first transmission control signal Tx1 becomes inactive (low level), and the drive signal Drv which is supplied to the pixel 110 repeats an active state (high level) and an inactive state (low level) at each time of a half cycle of the clock signal CLK.

In addition, the reset signal RST becomes active (high level) for a predetermined time at each cycle of the clock signal CLK. Thereby, the NMOS transistor M3 is turned on, the capacitor C0 is initialized, and a predetermined amount of electric charges (positive electric charges) are accumulated in the capacitor C0. In addition, at each cycle of the clock signal CLK, the reset signal RST returns to an inactive state (low level) and thereafter, at least one of the four signals Tx2a, Tx2b, Tx2c, and Tx2d which configure the second transmission control signal Tx2 becomes active (high level) for a predetermined time.

Specifically, first, when the resolution is set to 1200 dpi, only the signal Tx2a becomes active (high level) for a predetermined time during one cycle of the clock signal CLK. Second, only the signal Tx2b becomes active (high level) for a predetermined time during one cycle of the clock signal CLK. Third, only the signal Tx2c becomes active (high level) for a predetermined time during one cycle of the clock signal CLK. Fourth, only the signal Tx2d becomes active (high level) for a predetermined time during one cycle of the clock signal CLK. The four signals Tx2a, Tx2b, Tx2c, and Tx2d repeat this.

In addition, when the resolution is set to 600 dpi, only the two signals Tx2a and Tx2b first become active (high level) for a predetermined time during one cycle of the clock signal CLK. Next, only the two signals Tx2c and Tx2d become active (high level) for a predetermined time during one cycle of the clock signal CLK. This is repeated.

In addition, when the resolution is set to 300 dpi, the four signals Tx2a, Tx2b, Tx2c, and Tx2d simultaneously become active (high level) for a predetermined time during one cycle of the clock signal CLK, and this is repeated.

If at least one of the four signals Tx2a, Tx2b, Tx2c, and Tx2d becomes active (high level) for a predetermined time, at least one of the four NMOS transistors M21, M22, M23, and M24 is turned on, and a predetermined amount of electric charges (positive electric charges) accumulated in the capacitor C0 reduces by the amount of electric charges (negative electric charges) accumulated in at least one of the intermediate capacitors C1, C2, C3, and C4.

In addition, in the pixel 110 which is a read target of the pixel signal, the pixel selection signal SELi−1 becomes active (high level) for a predetermined time, the reset signal RST returns to an inactive state (low level), and thereafter, the pixel selection signal SELi becomes active (high level) for a predetermined time.

Thereby, the NMOS transistor M5 is turned on, and a current flowing through the NMOS transistor M4 changes depending on the electric charges accumulated in the capacitor C0. Thereby, a source potential of the NMOS transistor M4 changes, and a pixel signal of a voltage according to the source potential of the NMOS transistor M4 is output to the output signal line 301 from the pixel 110.

Meanwhile, since the pixel selection signal SELi−1 maintains an inactive state (low level) in the pixel 110 which is not a read target of the pixel signal, the pixel selection signal SELi is also in a low level. Hence, the NMOS transistor M5 is turned off, and the pixel signal is not output from the pixel 110.

An output of the voltage boosting circuit 111 is used for gate signals of the four NMOS transistors M11, M12, M13, and M14 so as to efficiently transmit the electric charges in a short time.

Figure 9:
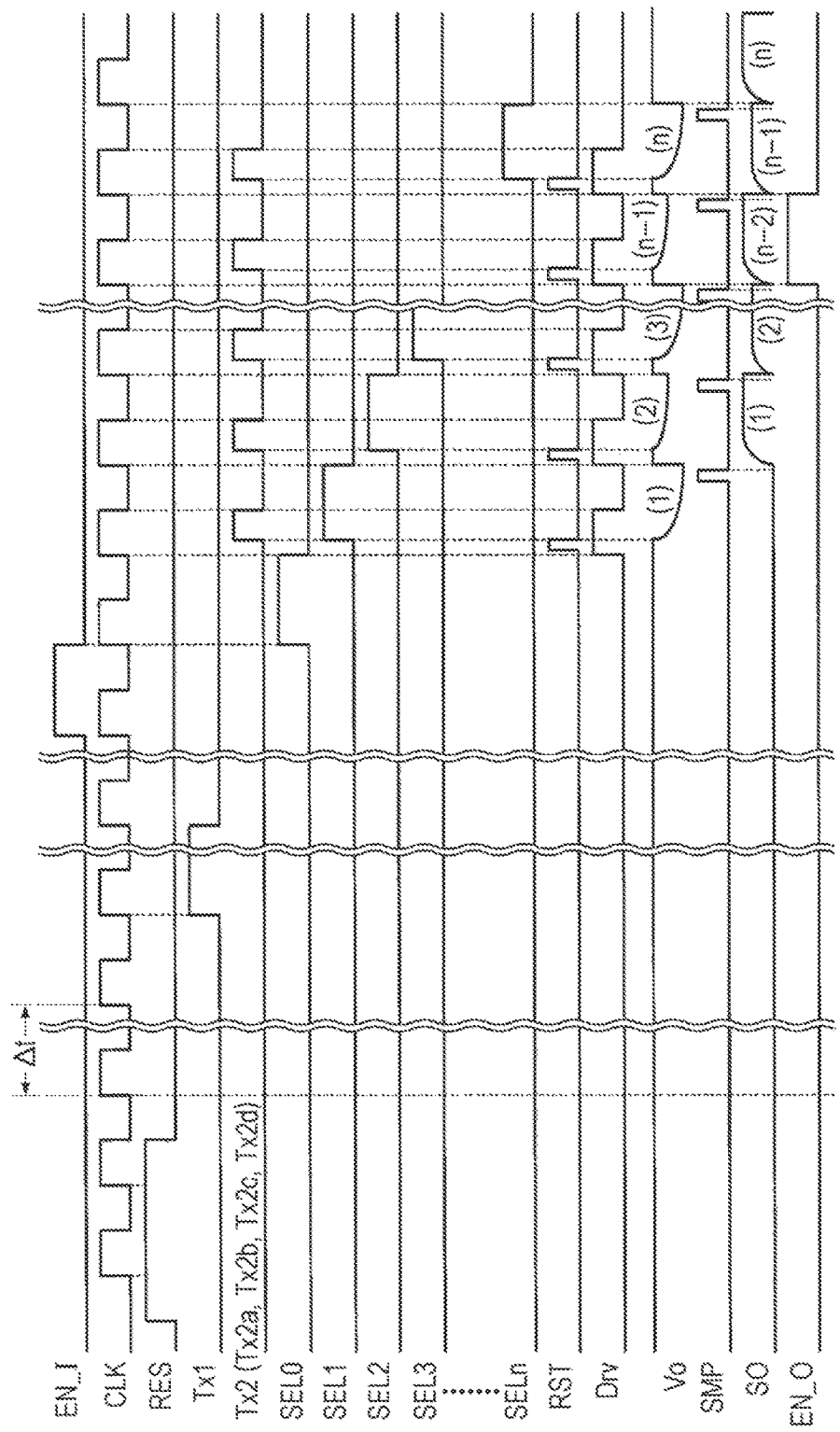
FIG. 9 is a timing chart of each signal of the image reading chip.

FIG. 9 is a timing chart of each signal of the image reading chip 415. FIG. 9 is a timing chart in a case where a resolution of an image which is read by the scanner unit (image reading apparatus) 3 is set to 300 dpi.

As illustrated in FIG. 9, the resolution setting signal RES first goes to a high level during two cycles of the clock signal CLK. If the exposure time Δt passes, various signals at 300 dpi are supplied to each pixel 110 hereafter.

First, the first transmission control signal Tx1 becomes active (high level) during several cycles of the clock signal CLK.

Next, if the chip enable signal EN_I (high pulse) is input, the pixel selection signal SEL0 becomes active (high level) during one cycle of the clock signal CLK.

Next, during a half cycle of the clock signal CLK, the drive signal Drv becomes active (high level) and the first transmission control signal Tx1 and the pixel selection signal SEL0 become inactive (low level) together. In addition, the reset signal RST becomes active (high level) in a short time with a slight delay.

Next, after the reset signal RST returns to an inactive state (low level), the four signals Tx2a, Tx2b, Tx2c, and Tx2d which configure the second transmission control signal Tx2 are all active (high level) until the clock signal CLK falls next time. In addition, the pixel selection signal SEL1 becomes active (high level), and thereby, the pixel signal from the first pixel 110 is output to the output signal line 301, and an image signal Vo becomes a voltage according to the pixel signal. Signal processing of the image signal Voltage is performed by the output circuit 120, and the image signal SO becomes a voltage corresponding to a first pixel signal in synchronization with falling of the sampling signal SMP.

Next, during a half cycle of the clock signal CLK, the drive signal Drv becomes active (high level), and the pixel selection signal SEL1 becomes inactive (low level). In addition, the reset signal RST becomes active (high level) in a short time with a slight delay.

Next, after the reset signal RST returns to inactive (low level), the four signals Tx2a, Tx2b, Tx2c, and Tx2d are active (high level) until the clock signal CLK falls next time. In addition, the pixel selection signal SEL2 becomes active (high level), and thereby, the pixel signal from the second pixel 110 is output to the output signal line 301 and the image signal Vo becomes a voltage according to the pixel signal. Signal processing of the image signal Vo is performed by the output circuit 120, and the image signal SO becomes a voltage corresponding to a second pixel signal in synchronization with falling of the sampling signal SMP.

Next, during a half cycle of the clock signal CLK, the drive signal Drv becomes active (high level), and the pixel selection signal SEL2 becomes inactive (low level). In addition, the reset signal RST becomes active (high level) in a short time with a slight delay.

Thereafter, the image signal SO becomes voltages according to third to nth pixel signals in synchronization with falling of the sampling signal SMP in the same manner as above.

In addition, shortly before outputting (outputting a voltage according to the nth pixel signal) the image signal SO ends, the chip enable signal EN_O (high pulse) is output, and if outputting the image signal SO ends, the output terminal OP1 goes to high impedance.

1-4. Consumption Current of Image Reading Apparatus (Image Reading Chip)

Figure 10:
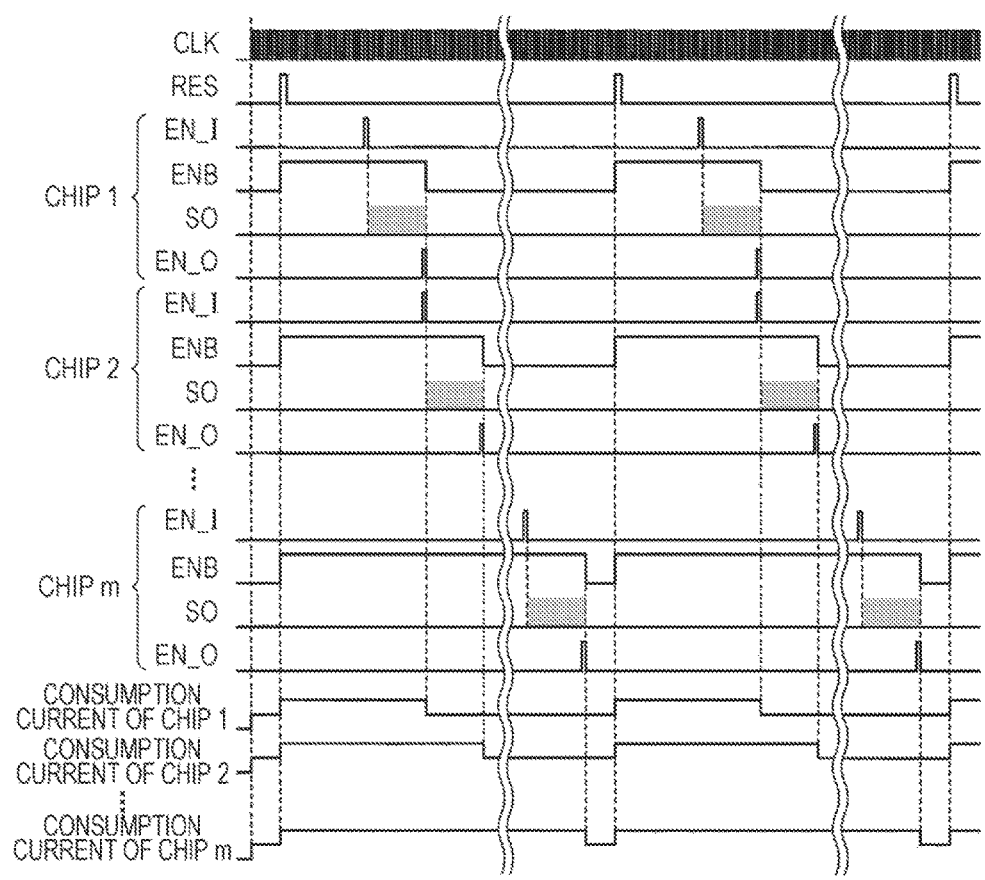
FIG. 10 is a timing chart schematically illustrating changes of a signal waveform and a consumption current of each of m image reading chips.

FIG. 10 is a timing chart schematically illustrating changes of a signal waveform and a consumption current of each of each of the m image reading chips 415-1 to 415-m while the scanner unit (image reading apparatus) 3 according to the first embodiment reads an image. In FIG. 10, the m image reading chips 415-1, 415-2, . . . , 415-m are denoted as chip 1, chip 2, . . . , chip m.

As described above, the voltage boosting circuits 111 and the reading circuit 130s (pixel drive circuits 112 and output circuits 120) of each of the image reading chips 415-1 to 415-m operate while the enable signal ENB is in a high level, and stop operations while the enable signal ENB is in a low level.

As illustrated in FIG. 10, the voltage boosting circuit 111 and the reading circuit 130 in the image reading chip 415-1 (chip 1) stops an operation while outputting the image signal SO ends and the next resolution setting signal RES is input, that is, while the image reading chips 415-2 to 415-m (chip 2 to chip m) sequentially output the image signals SO, and thus, the consumption current of the image reading chip 415-1 (chip 1) decreases during this period. In the same manner, the voltage boosting circuit 111 and the reading circuit 130 in the image reading chip 415-2 (chip 2) stops an operation while outputting the image signal SO ends and the next resolution setting signal RES is input, that is, while the image reading chips 415-3 to 415-m (chip 3 to chip m) sequentially output the image signals SO, and thus, the consumption current of the image reading chip 415-2 (chip 2) decreases during this period. Since the image reading chips 415-3 to 415-m (chip 3 to chip m) are also the same as above, the consumption current of the image reading chip 415-1 decreases the most, the consumption current of the image reading chip 415-2 decreases second to the most, and the consumption current of the image reading chip 415-m becomes the largest.

Figure 11:
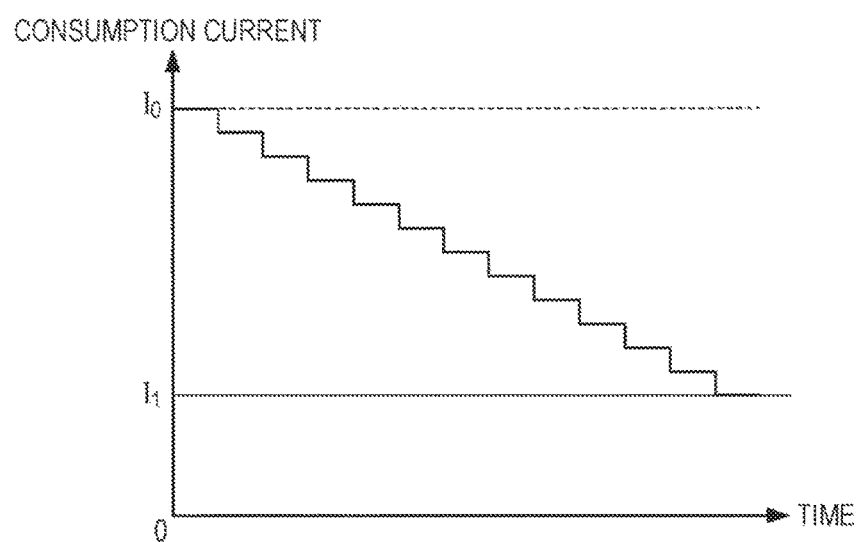
FIG. 11 is a diagram schematically illustrating a change of total consumption current of the m image reading chips during a period in which an image of one line is read.

FIG. 11 is a diagram schematically illustrating a change of total consumption current of the m image reading chips 415-1 to 415-m during a period in which an image of one line is read. In FIG. 11, a horizontal axis denotes time, and a vertical axis denotes a consumption current.

As denoted by a dashed line of FIG. 11, in a case where the voltage boosting circuit 111 and the reading circuit 130 in each of the m image reading chips 415-1 to 415-m constantly operate in contrast, the total consumption current is approximately constant as $I_0$. In contrast to this, all the voltage boosting circuit 111 and the reading circuit 130 of each of the m image reading chips 415-1 to 415-m in the scanner unit (image reading apparatus) 3 according to the first embodiment operate shortly after reading an image starts and thereby, the total consumption current is $I_0$, but as time passes, the number of the voltage boosting circuits 111 and the reading circuits 130 which stop an operation increases and thereby, the total consumption current decreases to $I_1$ in a stepwise pattern, as denoted by a solid line of FIG. 11. As such, according to the present embodiment, an effect of consumption current reduction is obtained, and the more the number (number of pixels) of image reading chips 415 is, the larger the effect of consumption current reduction is. For example, dozens of the image reading chips 415 are used for the scanner unit (image reading apparatus) 3 which can correspond to an A4 size, and many image reading chips 415 are used for the scanner unit (image reading apparatus) 3 which can correspond to an A3 size, and thus, the consumption current can be significantly reduced.

1-5. Operational Effects

As described above, the scanner unit (image reading apparatus) 3 according to the first embodiment stops the operations of the voltage boosting circuit 111 and the reading circuit 130 during a period when the reading circuit 130 ends outputting the image signal, in each of the m image reading chips 415-1 to 415-m. Furthermore, if the voltage boosting circuit 111 stops an operation, the second transmission control signal Tx2 is not generated, and the n pixels 110 also stop operations. Hence, each of the m image reading chips 415-1 to 415-m can be efficiently operated by the scanner unit (image reading apparatus) 3 or image reading chips according to the first embodiment, and thus, it is possible to reduce the total consumption current of the m image reading chips 415-1 to 415-m and to achieve low power consumption. Since low power consumption can be achieved, it is also possible to realize the scanner unit (image reading apparatus) 3 which can be used for an operation which is performed by receiving power through the universal serial bus (USB) or for a mobile device.

In addition, the scanner unit (image reading apparatus) 3 according to the first embodiment determines whether or not an output end determination circuit 107 stops outputting the image signal SO in each of the m image reading chips 415-1 to 415-m, and, if determining that outputting the image signal ends, stops the operations of the pixel 110, the voltage boosting circuit 111 and the reading circuit 130, and thus, control signals for stopping the pixel 110, the voltage boosting circuit 111, and the reading circuit 130 need not to be input from the outside of the chip. Accordingly, it is possible to prevent development cost or a development period from increasing due to addition of external components, a wiring change of a substrate, an increase of the size of the substrate, and the like. In addition, a total area of a circuit necessary for stopping the operations of the pixel 110, the voltage boosting circuit 111, and the reading circuit 130 is significantly small, and thus, it is also possible to realize each of the m image reading chips 415-1 to 415-m without increasing a size thereof.

In addition, since the scanner unit (image reading apparatus) 3 according to the first embodiment can achieve low power consumption, it is also possible to add another function such as constantly sensing insertion of paper by using the power which is saved, and to realize, for example, a high function or high reliability.

2. Second Embodiment

Hereinafter, in the complexer 1 according to a second embodiment, the same symbols or reference numerals will be attached to the same configuration elements as in the first embodiment, description overlapping with the first embodiment will be omitted, and description different from the first embodiment will be mainly made.

A structure of the complexer 1 according to the second embodiment is the same as in the first embodiment (FIGS. 1 to 4), and thus, illustration and description thereof will be omitted. In addition, a functional block diagram of the scanner unit (image reading apparatus) 3 according to the second embodiment is the same as in the first embodiment (FIG. 5), and thus, illustration and description thereof will be omitted. In addition, a functional block diagram of the image reading chip 415 according to the second embodiment is the same as in the first embodiment (FIG. 6), and thus, illustration and description thereof will be omitted. However, a configuration of the control circuit 100 in the image reading chip 415 according to the second embodiment is different from that in the first embodiment.

Figure 12:
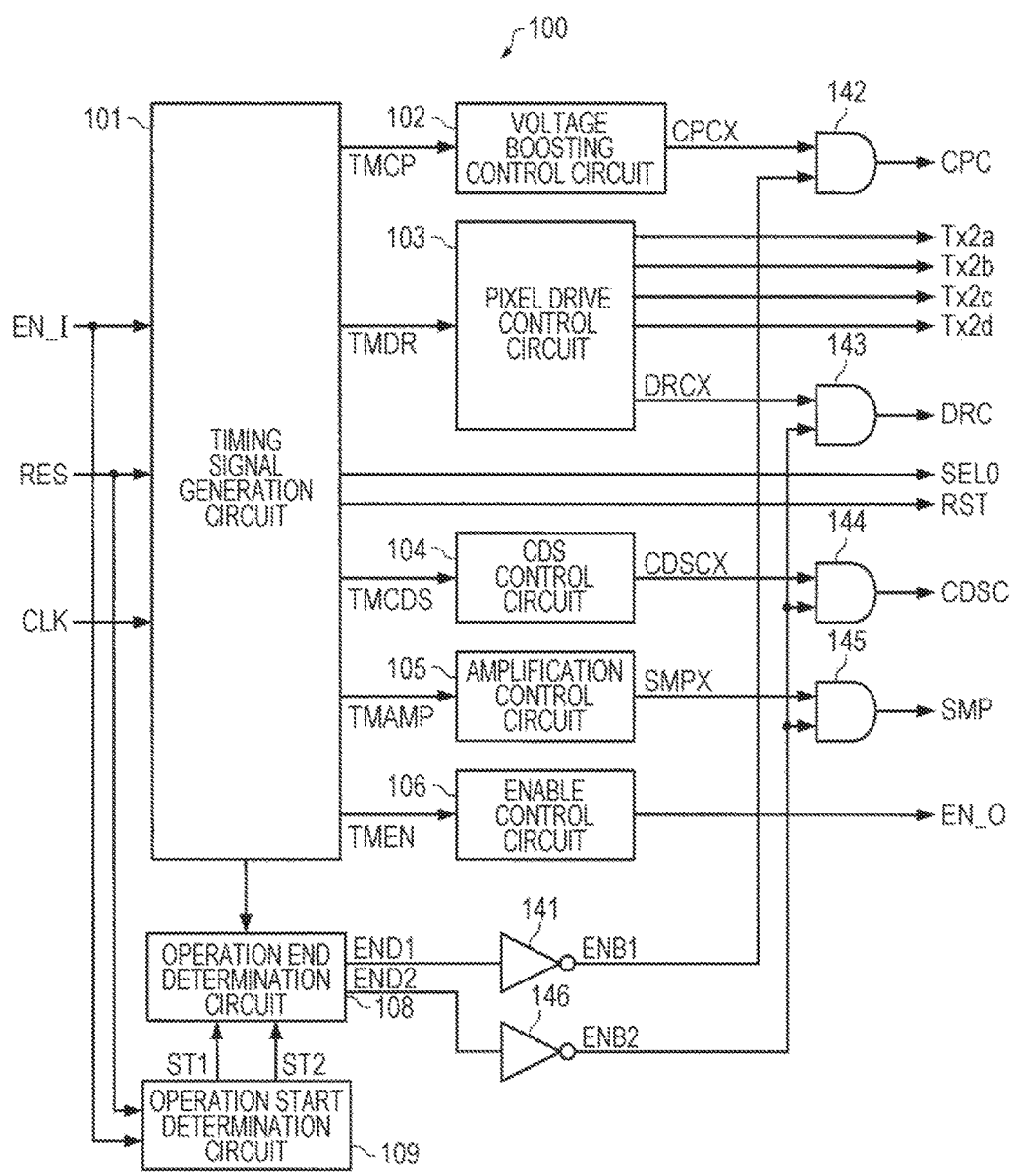
FIG. 12 is a diagram illustrating a configuration example of a control circuit according to a second embodiment.

FIG. 12 is a diagram illustrating a configuration example of the control circuit 100 according to the second embodiment. As illustrated in FIG. 12, in relation to the control circuit 100 according to the second embodiment, an operation end determination circuit 108 is replaced with the output end determination circuit 107 of the control circuit 100 (FIG. 7) according to the first embodiment, and an operation start determination circuit 109 and a NOT circuit 146 are added to the control circuit.

The operation end determination circuit 108 determines whether or not a predetermined period passes which includes a period until the second transmission control signal Tx2 is output from at least the control circuit 100 after a pulse of the resolution setting signal RES is input, based on a value of a timer included in the timing signal generation circuit 101, and outputs an end signal END1 which is active (high level in the present embodiment) in a case where it is determined that the predetermined time passes.

In addition, the operation end determination circuit 108 determines whether or not outputting the image signal SO from the reading circuit 130 (output circuit 120) ends, based on bit data retained in a resolution setting register included in a timing signal generation circuit 101 and the value of the timer, and outputs an end signal END2 which is active (high level in the present embodiment) in a case where it is determined the outputting ends.

If the pulse of the resolution setting signal RES is input, the operation start determination circuit 109 outputs a start signal ST1 to the operation end determination circuit 108. The operation end determination circuit 108 makes the end signal END1 inactive (low level) if receiving the start signal ST1. That is, in the present embodiment, the end signal END1 becomes inactive (low level) during a predetermined period after the pulse of the resolution setting signal RES is input, and becomes active (high level) during a period until the pulse of the resolution setting signal RES is input after the predetermined period passes.

In addition, if the chip enable signal EN_I (signal with a high pulse) is input, the operation start determination circuit 109 outputs a start signal ST2 to the operation end determination circuit 108. The operation end determination circuit 108 makes the end signal END2 inactive (low level) if receiving the start signal ST2. That is, in the present embodiment, the end signal END2 becomes inactive (low level) during a predetermined period until outputting the image signal SO ends after the chip enable signal EN_I (high pulse) is input, and becomes active (high level) during a period until the chip enable signal EN_I (high pulse) is input after outputting the image signal SO ends.

The NOT circuit 141 outputs an enable signal ENB1 which is obtained by inverting a logic level of the end signal END1 that is output from the operation end determination circuit 108. Hence, the enable signal ENB1 is in a high level during a predetermined period after the pulse of the resolution setting signal RES is input, and is in a low level during a period until the pulse of the resolution setting signal RES is input after a predetermined time passes.

The NOT circuit 146 outputs an enable signal ENB2 which is obtained by inverting a logic level of the end signal END2 that is output from the operation end determination circuit 108. Hence, the enable signal ENB2 is in a high level during a period until outputting the image signal SO ends after the chip enable signal EN_I (signal with a high pulse) is input, and is in a low level during a period until the next chip enable signal EN_I (signal with a high pulse) is input after outputting the image signal SO end.

The AND circuit 142 outputs a signal which is obtained by performing logical product of the control signal CPCX which is output from the voltage boosting control circuit 102 and the enable signal ENB1, and an output signal of the AND circuit 142 is supplied to the voltage boosting circuit 111 as the control signal CPC.

The AND circuit 143 outputs a signal which is obtained by performing logical product of the control signal DRCX that is output from the pixel drive control circuit 103 and the enable signal ENB2, and an output signal of the AND circuit 143 is supplied to the pixel drive circuit 112 as the control signal DRC.

The AND circuit 144 outputs a signal which is obtained by performing logical product of the control signal CDSCX that is output from the CDS control circuit 104 and the enable signal ENB2, and an output signal of the AND circuit 144 is supplied to the CDS circuit 121 as the control signal CDSC.

The AND circuit 145 outputs a signal which is obtained by performing logical product of the sampling signal SMPX that is output from the amplification control circuit 105 and the enable signal ENB2, and an output signal of the AND circuit 145 is supplied to the amplification circuit 122 as the sampling signal SMP.

While the enable signal ENB1 is in a high level, that is, during a period after the pulse of the resolution setting signal RES is input, the control signal CPCX becomes the control signal CPC by propagating through the AND circuit 142, and thereby, the voltage boosting circuit 111 operates. In contrast, while the enable signal ENB1 is in a low level, that is, during a period until the pulse of the resolution setting signal RES is input after a predetermined time passes, the control signal CPC is fixed to a low level, and thereby, the voltage boosting circuit 111 stops the operation. In other words, the voltage boosting circuit 111 operates during a predetermined period after the resolution setting signal RES (an example of the "control signal") is input to the input terminal IP2, and stops the operation during a period after outputting the image signal SO ends.

In addition, while the enable signal ENB2 is in a high level, that is, during a period until outputting the image signal SO ends after the chip enable signal EN_I (signal with a high pulse) is input, the control signal DRCX, the control signal CDSCX, and the sampling signal SMPX respectively propagate through the AND circuit 143, the AND circuit 144, and the AND circuit 145, thereby, becoming the control signal DRC, the control signal CDSC, and the sampling signal SMP. Accordingly, the reading circuit 130 (the pixel drive circuit 112 and the output circuit 120) operate. In contrast, while the enable signal ENB2 is in a low level, that is, during a period until the chip enable signal EN_I (signal with a high pulse) is input after outputting the image signal SO ends, the control signal DRC, the control signal CDSC, and the sampling signal SMP are fixed to a low level, and thereby, the reading circuit 130 (the pixel drive circuit 112 and the output circuit 120) stop the operations.

Figure 13:
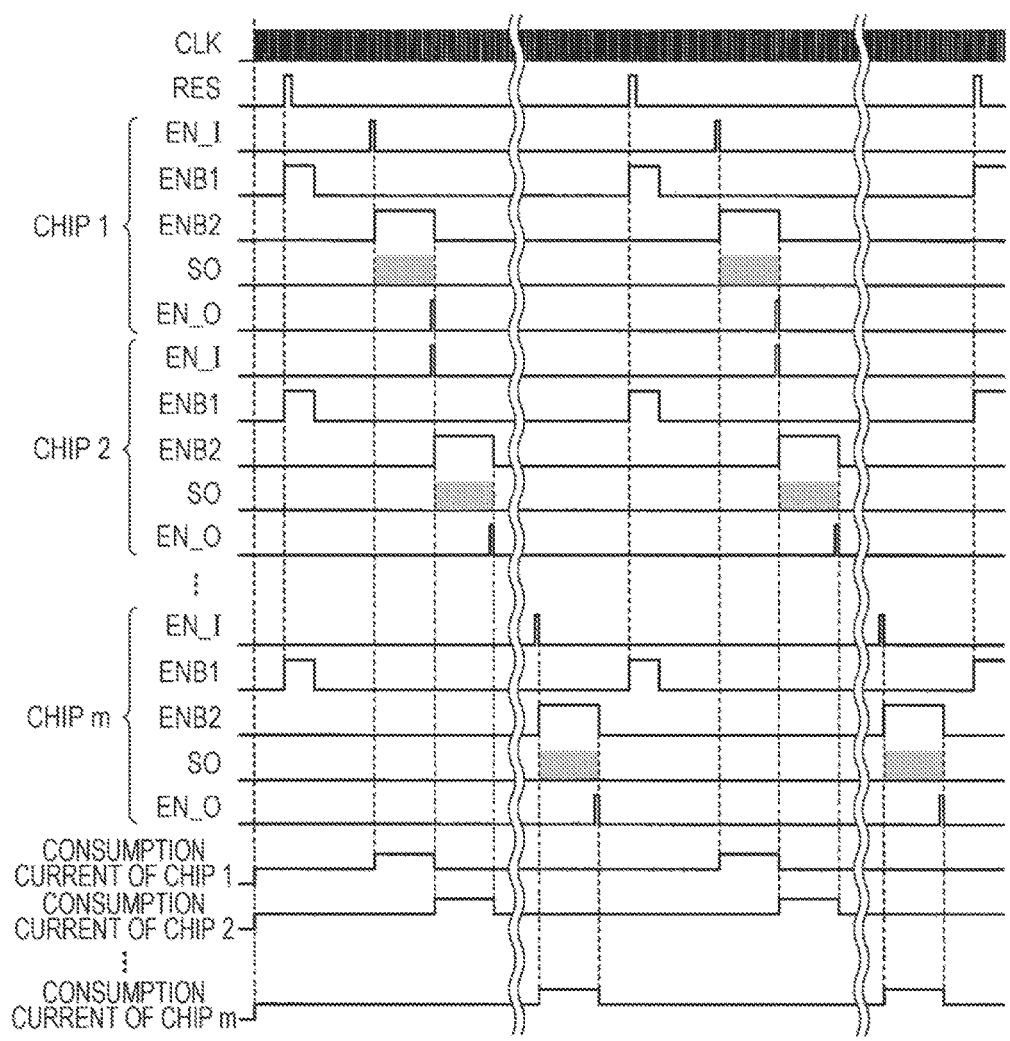
FIG. 13 is a timing chart schematically illustrating changes of a signal waveform and a consumption current of each of m image reading chips according to the second embodiment.

FIG. 13 is a timing chart schematically illustrating changes of a signal waveform and a consumption current of each of the m image reading chips 415-1 to 415-m while the scanner unit (image reading apparatus) 3 according to the second embodiment reads an image. In FIG. 13, the m image reading chips 415-1, 415-2, . . . , 415-m are denoted as chip 1, chip 2, . . . , chip m.

As described above, the voltage boosting circuit 111 in each of the image reading chips 415-1 to 415-m operates while the enable signal ENB1 is in a high level, and stops the operation while the enable signal ENB1 is in a low level. In addition, the reading circuit 130 (the pixel drive circuit 112 and the output circuit 120) operates while the enable signal ENB2 is in a high level, and stops the operation while the enable signal ENB2 is in a low level.

As illustrated in FIG. 13, the voltage boosting circuits 111 in the image reading chips 415-1 to 415-m (chip to chip m) operate during a period after the resolution setting signal RES is input. That is, the voltage boosting circuit 111 operates at least during a period in which the light receiving elements PD1, PD2, PD3, and PD4 of the pixel 110 receive light, and during a period in which electric charges generated on the basis of photoelectric conversion that is performed by the light receiving elements PD1, PD2, PD3, and PD4 are transmitted by the first transmission control signal Tx1.

In addition, the voltage boosting circuits 111 in the image reading chips 415-1 to 415-m (chip 1 to chip m) stop the operations during a period between the time when predetermined time passes after the resolution setting signal RES is input and the time when the next resolution setting signal RES is input. Hence, the voltage boosting circuit 111 of the image reading chip 415-1 stops the operation at least during a period in which the reading circuits 130 of the other (m−1) image reading chips 415-2 to 415-m output the image signals SO, as illustrated in FIG. 13. In the same manner, the voltage boosting circuit 111 of the image reading chip 415-2 stops the operation at least during a period in which the reading circuits 130 of the (m−1) image reading chips 415-1, 415-3 to 415-m output the image signals SO, and the voltage boosting circuit 111 of the image reading chip 415-m stops the operation at least during a period in which the reading circuits 130 of the (m−1) image reading chip 415-1 to 415-(m−1) output the image signals SO. As such, the voltage boosting circuits 111 of the image reading chips 415-1 to 415-m (chip 1 to chip m) stop the operations all the time while the image signals SO are output, and thus, the consumption currents of the image reading chips 415-1 to 415-m (chip 1 to chip m) are reduced.

In addition, the reading circuit 130 in each of the image reading chips 415-1 to 415-m (chip 1 to chip m) stops the operation during a period until outputting the image signal SO stops after the chip enable signal EN_I (signal with a high pulse) is input, that is, during a period in which the reading circuits 130 of the other (m−1) image reading chips 415 output the image signals SO, and operates only the period in which the image signal SO is output. Accordingly, the consumption currents of the image reading chips 415-1 to 415-m (chip 1 to chip m) are significantly reduced.

Figure 14:
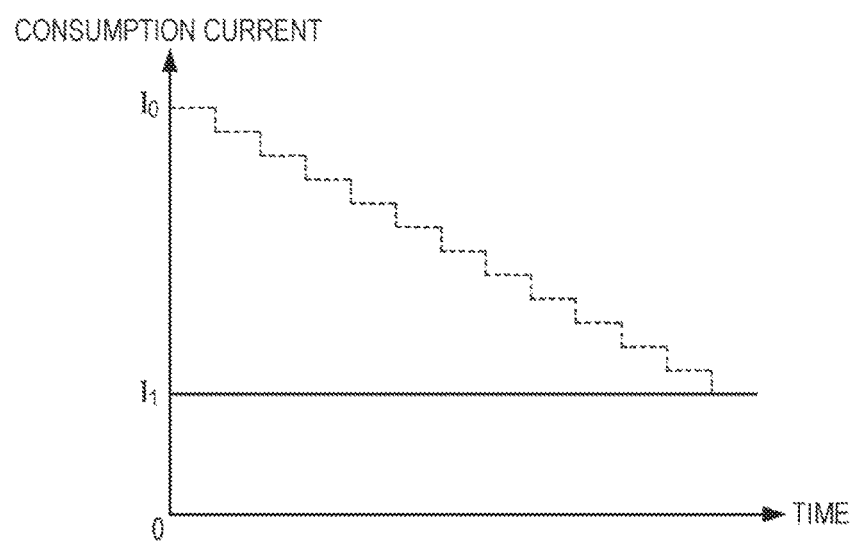
FIG. 14 is a diagram schematically illustrating a change of total consumption current of the m image reading chips during a period in which an image of one line is read, according to the second embodiment.

FIG. 14 is a diagram schematically illustrating a change of total consumption current of the m image reading chips 415-1 to 415-m during a period in which an image of one line is read, according to the second embodiment. As illustrated in FIG. 14, a horizontal axis denotes time and a vertical axis denotes a consumption current. A dashed line denotes an overview (refer to FIG. 11) of a change of the total consumption current according to the first embodiment.

As denoted by a solid line of FIG. 14, the reading circuits 130 (whose consumption currents are considerably larger than that of the voltage boosting circuit 111) of each of the m image reading chips 415-1 to 415-m in the scanner unit (image reading apparatus) 3 according to the second embodiment exclusively operate (a plurality of reading circuits 130 does not simultaneously operate) (refer to FIG. 13), and thus, the total consumption current maintains an approximately constant current value $I_1$. As such, according to the second embodiment, an effect in which a consumption current is reduced more than that in the first embodiment is obtained, and the larger the number (the number of pixels) of image reading chips 415 is, the larger the effect in which the consumption current is reduced is.

According to the scanner unit (image reading apparatus) 3 of the second embodiment described above, the same effect as in the first embodiment is obtained.

In addition, the pixel 110, the voltage boosting circuit 111, and the reading circuit 130 stop operations, during a period in which the reading circuits 130 of the other image reading chips 415 output the image signals SO, among the m image reading chips 415-1 to 415-m in the scanner unit (image reading apparatus) 3 according to the second embodiment. Accordingly, each of the m image reading chips 415-1 to 415-m can efficiently operate. Furthermore, the reading circuits 130 of the m image reading chips 415-1 to 415-m in the scanner unit (image reading apparatus) 3 according to the second embodiment stop the operations during the period in which the image signal SO is not output, and thus each of the m image reading chips 415-1 to 415-m can operate more efficiently. Hence, according to the scanner unit (image reading apparatus) 3 of the second embodiment, it is possible to reduce the total consumption current of the m image reading chips 415-1 to 415-m more than that in the first embodiment, and to achieve the lower power consumption.

In addition, the operation end determination circuit 108 of each of the m image reading chips 415-1 to 415-m in the scanner unit (image reading apparatus) 3 according to the second embodiment determines whether or not a predetermined period passes after the pulse of the resolution setting signal RES is input, and in a case where it is determined that the predetermined period passes, the pixel 110 and the voltage boosting circuit 111 stop operations. Accordingly, it is not necessary for control signals for stopping the operations of the pixel 110 and the voltage boosting circuit 111 to be input from the outside. In addition, the operation end determination circuit 108 determines whether or not outputting the image signal SO ends, and stops the operation of reading circuit 130 in a case where it is determined that outputting the signal ends. Accordingly, it is not necessary for a control signal for stopping an operation of the reading circuit 130 to be input from the outside. Thus, it is possible to prevent development cost or a development period from increasing due to addition of external components, a wiring change of a substrate, an increase of the size of the substrate, and the like. In addition, a total area of a circuit necessary for stopping the operations of the pixel 110, the voltage boosting circuit 111, and the reading circuit 130 is significantly small, and thus, it is also possible to realize each of the m image reading chips 415-1 to 415-m without increasing a size thereof.

3. Third Embodiment

Hereinafter, in the complexer 1 according to a third embodiment, the same symbols or reference numerals will be attached to the same configuration elements as in the first or second embodiment, description overlapping with the first or second embodiment will be omitted, and description different from the first or second embodiment will be mainly made.

A structure of the complexer 1 according to the third embodiment is the same as in the first embodiment (FIGS. 1 to 4), and thus, illustration and description thereof will be omitted. In addition, a functional block diagram of the scanner unit (image reading apparatus) 3 according to the third embodiment is the same as in the first embodiment (FIG. 5), and thus, illustration and description thereof will be omitted.

Figure 15:
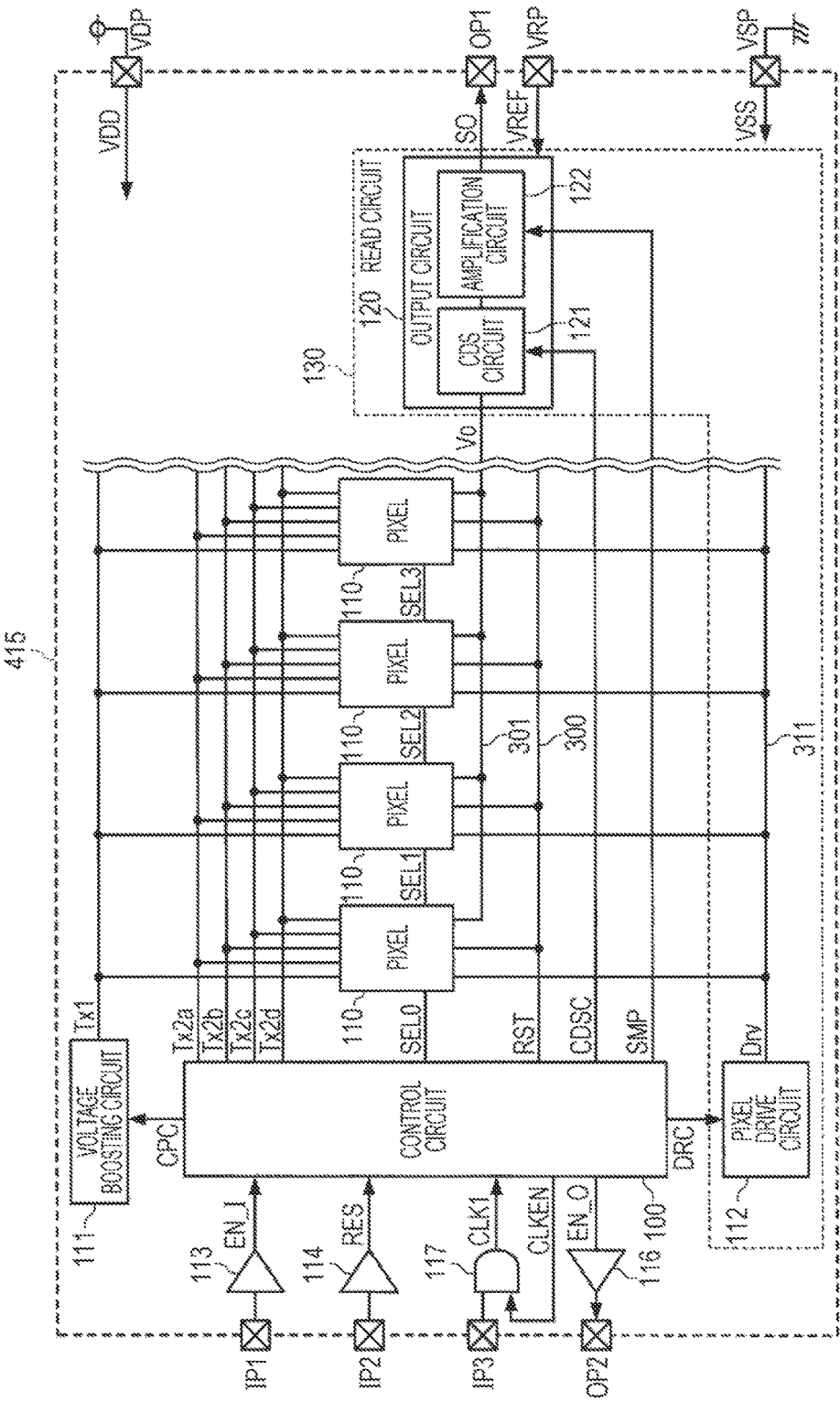
FIG. 15 is a functional block diagram of an image reading chip according to a third embodiment.

FIG. 15 is a functional block diagram of an image reading chip 415 according to the third embodiment. As illustrated in FIG. 15, in relation to a control circuit 100 according to the third embodiment, an AND circuit 117 is replaced with the input buffer 115 of the image reading chip 415 according to the first embodiment (FIG. 6). The AND circuit 117 outputs a clock signal CLK1 that is a signal being obtained by performing logical product of the clock signal CLK which is inputted through the input terminal IP3 and an enable signal CLKEN which is output from the control circuit 100. Hence, when the enable signal CLKEN goes to a high level, the clock signal CLK propagates through the AND circuit 117 to become the clock signal CLK1, and when the enable signal CLKEN goes to a low level, the clock signal CLK1 is fixed to a low level.

The clock signal CLK1 becomes an operation clock signal of the control circuit 100. Hence, the control circuit 100 operates in response to the clock signal CLK1 when the enable signal CLKEN goes to a high level, and stops the operation when the enable signal CLKEN goes to a low level.

Figure 16:
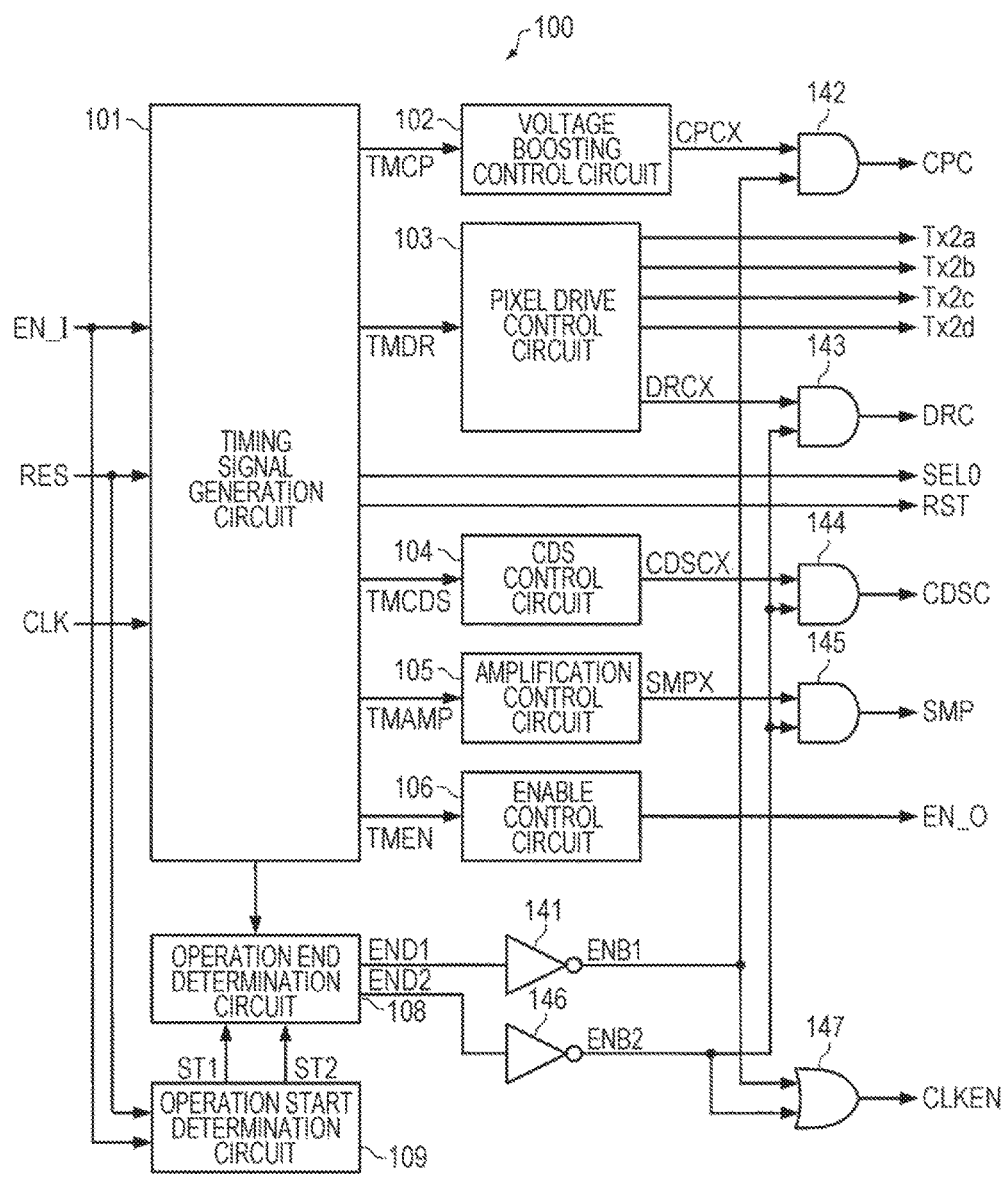
FIG. 16 is a diagram illustrating a configuration example of a control circuit according to the third embodiment.

The FIG. 16 is a diagram illustrating a configuration example of the control circuit 100 according to the third embodiment. As illustrated in FIG. 16, an OR circuit 147 is added to the control circuit 100 according to the third embodiment, compared with the control circuit 100 (FIG. 12) according to the second embodiment.

The OR circuit 147 outputs a signal that is obtained by performing logical sum of the enable signal ENB1 and the enable signal ENB2, and an output signal of the OR circuit 147 is supplied to the AND circuit 117 (refer to FIG. 15) as the enable signal CLKEN. The enable signal CLKEN goes to a high level when one or both of the enable signal ENB1 and the enable signal ENB2 go to a high level, and goes to a low level when both of the enable signal ENB1 and the enable signal ENB2 go to a low level. That is, the enable signal CLKEN goes to a high level during a predetermined period (period in which the voltage boosting circuit 111 operates) after a pulse of the resolution setting signal RES is input and during a period (period in which the reading circuit 130 operates) until outputting the image signal SO ends after the chip enable signal EN_I (signal with a high pulse) is input, and the clock signal CLK propagates through the AND circuit 117 to be output as the clock signal CLK1. In contrast, during a period in which the voltage boosting circuit 111 and the reading circuit 130 stop operations together, propagation of the clock signal CLK as the clock signal CLK1 is stopped by the AND circuit 117.

Figure 17:
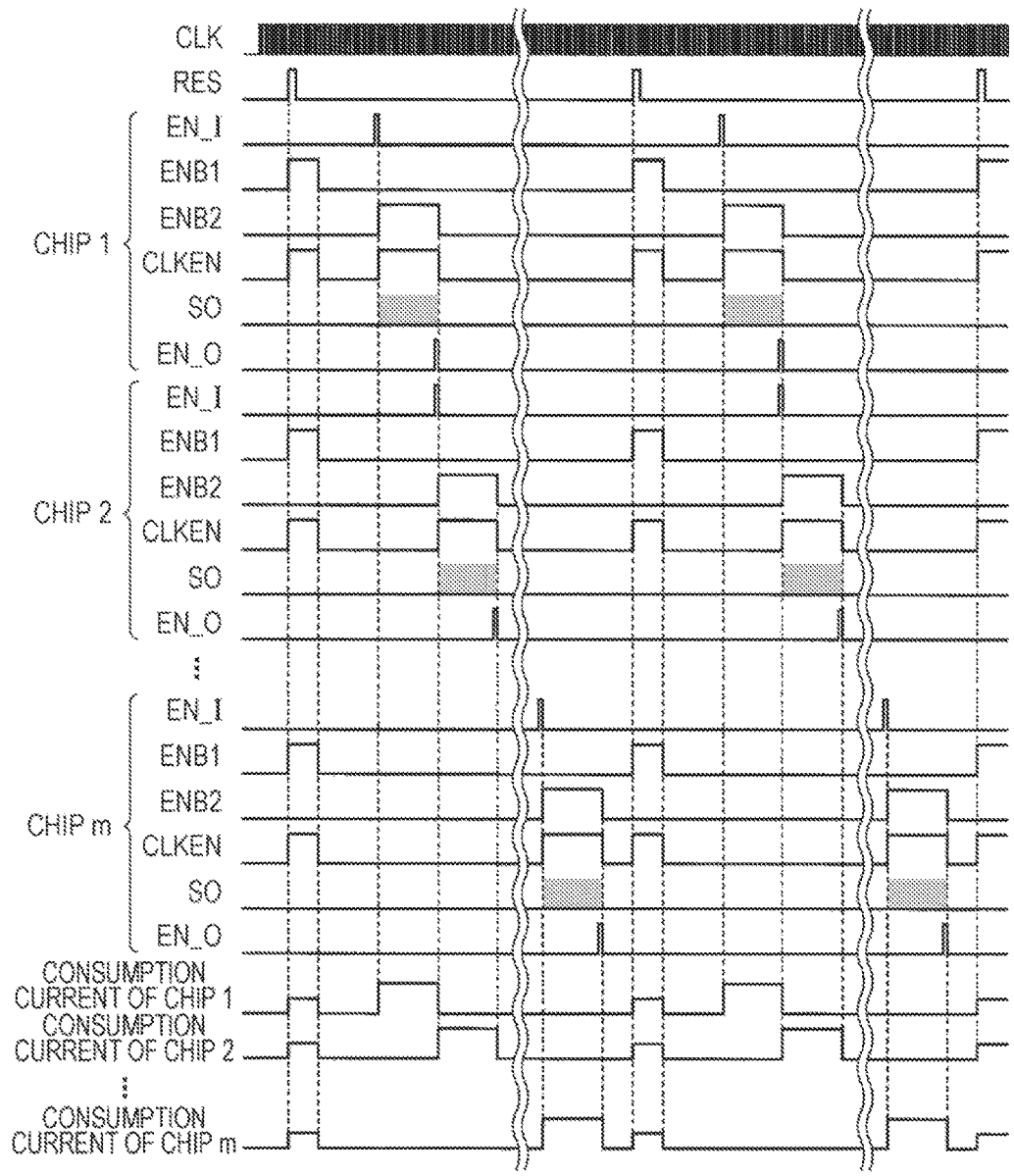
FIG. 17 is a timing chart schematically illustrating changes of a signal waveform and a consumption current of each of m image reading chips, in the third embodiment.

FIG. 17 is a timing chart schematically illustrating changes of a signal waveform and a consumption current of each of the m image reading chips 415-1 to 415-m, while the scanner unit (image reading apparatus) 3 according to the third embodiment reads an image. In FIG. 17, the m image reading chips 415-1, 415-2, . . . , 415-m are denoted as chip 1, chip 2, . . . , chip m.

In the same manner as in the second embodiment, the voltage boosting circuits 111 of each of the m image reading chips 415-1 to 415-m operate while the enable signal ENB1 is in a high level, and stop operations while the enable signal ENB1 is in a low level. In addition, the reading circuits 130 (pixel drive circuits 112 and output circuits 120) operate while the enable signal ENB2 is in a high level, and stop the operations while the enable signal ENB2 is in a low level.

Furthermore, in the third embodiment, while the enable signal CLKEN is in a low level (the enable signal ENB1 and the enable signal ENB2 are in a low level together), the clock signal CLK is input to the AND circuit 117, and thus, consumption currents of the image reading chips 415-1 to 415-m (chip 1 to chip m) are greatly reduced.

Figure 18:
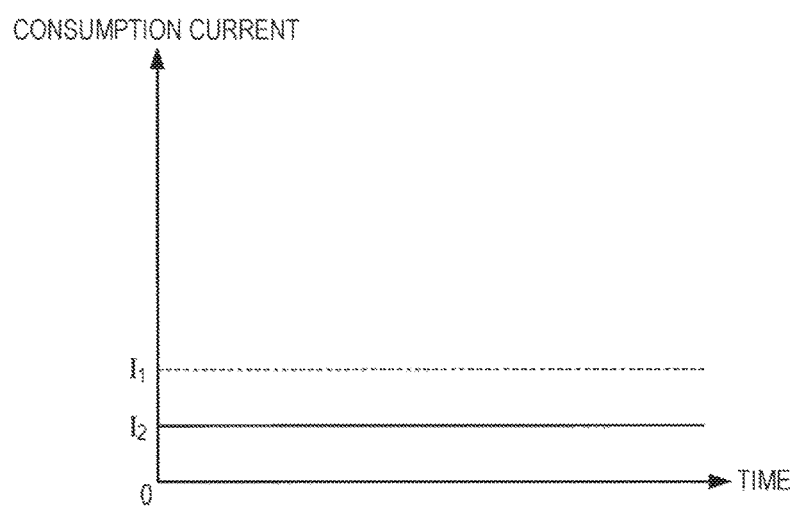
FIG. 18 is a diagram schematically illustrating a change of total consumption current of the m image reading chips during a period in which an image of one line is read, in the third embodiment.

FIG. 18 is a diagram schematically illustrating a change of total consumption current of the m image reading chips 415-1 to 415-m during a period in which an image of one line is read, in the third embodiment. In FIG. 18, a horizontal axis denotes time and a vertical axis denotes a consumption current. A dashed line denotes an overview (refer to FIG. 14) of the change of the total consumption current according to the second embodiment.

As denoted by a solid line of FIG. 18, the reading circuits 130 of each of the m image reading chips 415-1 to 415-m in the scanner unit (image reading apparatus) 3 according to the third embodiment exclusively operate (a plurality of reading circuits 130 does not simultaneously operate) (refer to FIG. 17), the clock signal CLK does not propagate during a period in which the voltage boosting circuit 111 and the reading circuit 130 stop operation together, and thus, the total consumption current is smaller than a current value $I_1$ and maintains an approximately constant current value $I_2$. As such, according to the third embodiment, an effect in which a consumption current is reduced more than that in the second embodiment is obtained, and the larger the number (the number of pixels) of image reading chips 415 is, the larger the effect in which the consumption current is reduced is.

As described above, according to the scanner unit (image reading apparatus) 3 of the third embodiment, the same effects as in the second embodiment are obtained.

In addition, in the m image reading chips 415-1 to 415-m in the scanner unit (image reading apparatus) 3 according to the third embodiment, propagation of the clock signal CLK which is supplied to the input terminal IP2 to the control circuit 100 stops while the pixels 110, the voltage boosting circuits 111, and the reading circuits 130 stop operations, and thus, it is possible to reduce a large consumption current necessary for propagating the clock signal CLK. Hence, according to the scanner unit (image reading apparatus) 3 according to the third embodiment, it is possible to further reduce the total consumption current of the m image reading chips 415-1 to 415-m than that of the second embodiment, and to achieve lower power consumption.

As described above, the present embodiments are described, but the invention is not limited to this, and can be realized in various forms in a range without departing from a gist thereof. For example, it is also possible to appropriately combine the respective embodiments.

The invention includes substantially the same configuration (for example, a configuration in which a function, a method, and results are the same, or a configuration in which an object and effects are the same) as the configuration described in the embodiments. In addition, the invention includes a configuration in which a non-essential part of the configuration described in the embodiments is replaced. In addition, the invention includes a configuration which obtains the same operational effects as those of the configuration described in the embodiments, or a configuration which can achieve the same object. In addition, the invention includes a configuration in which a known technology is added to the configuration described in the embodiments.

What is claimed is:

1. An image reading apparatus comprising:
   a plurality of image reading chips for reading an image,
   wherein each of the plurality of image reading chips includes:
      a pixel that includes a light receiving element which receives light from the image and performs photoelectric conversion;
      a voltage boosting circuit that generates a transmission control signal for transmitting electric charges which are generated on the basis of the photoelectric conversion that is performed by the light receiving element; and
      a reading circuit which generates an image signal on the basis of the electric charges which are transmitted and outputs the image signal,
   wherein the voltage boosting circuit operates during a period in which the light receiving element of the pixel receives the light and during a period in which the electric charges that are generated on the basis of the photoelectric conversion which is performed by the light receiving element are transmitted, and stops an operation during a period in which reading circuits of other image reading chips of the plurality of image reading chips output image signals.

2. The image reading apparatus according to claim 1, wherein each of the plurality of image reading chips operates only in a period in which the reading circuit outputs the image signal.

3. The image reading apparatus according to claim 2,
   wherein each of the plurality of image reading chips includes a switch that determines whether or not to activate the pixel in response to the transmission control signal, and
   wherein the electric charges that are generated on the basis of the photoelectric conversion which is performed by the light receiving element are transmitted through the switch.

4. The image reading apparatus according to claim 2, wherein the reading circuit of each of the plurality of image reading chips stops operation during a period in which the reading circuits of the other image reading chips output the image signals.

5. The image reading apparatus according to claim 2,
   wherein each of the plurality of image reading chips operates in response to a clock signal that is supplied to an input terminal, and
   wherein propagation of the clock signal stops during a period in which the voltage boosting circuit and the reading circuit stop operations together.

6. The image reading apparatus according to claim 2, wherein the reading circuit of each of the plurality of image reading chips includes:
   a pixel drive circuit that generates a drive signal for reading a signal from the pixel on the basis of the electric charges which are transmitted; and
   an output circuit that generates the image signal and outputs the image signal.

7. The image reading apparatus according to claim 1,
   wherein each of the plurality of image reading chips includes a switch that determines whether or not to activate the pixel in response to the transmission control signal, and
   wherein the electric charges that are generated on the basis of the photoelectric conversion which is performed by the light receiving element are transmitted through the switch.

8. The image reading apparatus according to claim 7, wherein the reading circuit of each of the plurality of image reading chips stops operation during a period in which the reading circuits of the other image reading chips output the image signals.

9. The image reading apparatus according to claim 7,
   wherein each of the plurality of image reading chips operates in response to a clock signal that is supplied to an input terminal, and
   wherein propagation of the clock signal stops during a period in which the voltage boosting circuit and the reading circuit stop operations together.

10. The image reading apparatus according to claim 7, wherein the reading circuit of each of the plurality of image reading chips includes:
    a pixel drive circuit that generates a drive signal for reading a signal from the pixel on the basis of the electric charges which are transmitted; and
    an output circuit that generates the image signal and outputs the image signal.

11. The image reading apparatus according to claim 1, wherein the reading circuit of each of the plurality of image reading chips stops operation during a period in which the reading circuits of the other image reading chips output the image signals.

12. The image reading apparatus according to claim 11,
    wherein each of the plurality of image reading chips operates in response to a clock signal that is supplied to an input terminal, and
    wherein propagation of the clock signal stops during a period in which the voltage boosting circuit and the reading circuit stop operations together.

13. The image reading apparatus according to claim 11, wherein the reading circuit of each of the plurality of image reading chips includes:
    a pixel drive circuit that generates a drive signal for reading a signal from the pixel on the basis of the electric charges which are transmitted; and
    an output circuit that generates the image signal and outputs the image signal.

14. The image reading apparatus according to claim 1,
wherein each of the plurality of image reading chips operates in response to a clock signal that is supplied to an input terminal, and
wherein propagation of the clock signal stops during a period in which the voltage boosting circuit and the reading circuit stop operations together.

15. The image reading apparatus according to claim 14, wherein the reading circuit of each of the plurality of image reading chips includes:
a pixel drive circuit that generates a drive signal for reading a signal from the pixel on the basis of the electric charges which are transmitted; and
an output circuit that generates the image signal and outputs the image signal.

16. The image reading apparatus according to claim 1, wherein the reading circuit of each of the plurality of image reading chips includes:
a pixel drive circuit that generates a drive signal for reading a signal from the pixel on the basis of the electric charges which are transmitted; and
an output circuit that generates the image signal and outputs the image signal.

17. A semiconductor device comprising:
a pixel that includes a light receiving element which receives light and performs photoelectric conversion;
a voltage boosting circuit that generates a transmission control signal for transmitting electric charges which are generated on the basis of the photoelectric conversion that is performed by the light receiving element;
a reading circuit which generates an image signal on the basis of the electric charges which are transmitted and outputs the image signal;
a switch that determines whether or not to activate the pixel in response to the transmission control signal; and
an input terminal to which a control signal is input,
wherein the voltage boosting circuit operates during a predetermined period after the control signal is input to the input terminal, and stops an operation during a period after outputting the image signal ends,
wherein the reading circuit includes a pixel drive circuit and an output circuit,
wherein the pixel drive circuit generates a drive signal for reading a signal from the pixel on the basis of the electric charges which are transmitted,
wherein the output circuit generates the image signal, reduces noise in the image signal, and amplifies the image signal, and
wherein the electric charges that are generated on the basis of the photoelectric conversion which is performed by the light receiving element are transmitted through the switch.

18. The semiconductor device according to claim 17, wherein the control signal is a clock signal.

19. The semiconductor device according to claim 18, wherein propagation of the clock signal stops during a period in which the voltage boosting circuit and the reading circuit stop operations together.

* * * * *